United States Patent
Tanzawa

(10) Patent No.: US 8,681,561 B2
(45) Date of Patent: Mar. 25, 2014

(54) APPARATUSES AND METHODS INCLUDING MEMORY WRITE OPERATION

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 13/214,841

(22) Filed: Aug. 22, 2011

(65) Prior Publication Data

US 2013/0051161 A1 Feb. 28, 2013

(51) Int. Cl.
*G11C 11/34* (2006.01)
*G11C 16/04* (2006.01)

(52) U.S. Cl.
USPC ............. 365/185.18; 365/185.17; 365/185.26

(58) Field of Classification Search
USPC ............................ 365/185.17, 185.18, 185.26
See application file for complete search history.

(56) References Cited

U.S. PATENT DOCUMENTS

| 5,555,204 | A * | 9/1996 | Endoh et al. ............. 365/185.22 |
| 7,292,476 | B2 | 11/2007 | Goda et al. |
| 7,362,616 | B2 | 4/2008 | Bovino et al. |
| 2007/0170979 | A1 | 7/2007 | Campardo et al. |
| 2009/0257272 | A1 | 10/2009 | Stembridge et al. |
| 2009/0279360 | A1 | 11/2009 | Lee et al. |
| 2011/0292734 | A1 * | 12/2011 | Kim ........................ 365/185.19 |

FOREIGN PATENT DOCUMENTS

JP 02011054226 A * 3/2011

* cited by examiner

*Primary Examiner* — Vanthu Nguyen
(74) *Attorney, Agent, or Firm* — Schwegman, Lundberg & Woessner, P.A.

(57) ABSTRACT

Some embodiments include apparatuses and methods having memory cells and access lines coupled to the memory cells. In one such apparatus, the access lines include a first access line and a second access line. The first access line can be adjacent to the second access line. The memory cells include a memory cell associated with the second access line. A module can be configured to apply a voltage to the first access line during an operation of accessing the memory cell associated with the second access line, and to place the second access line in a floating state during at least a portion of a time interval within the operation. Other embodiments including additional apparatus and methods are described.

41 Claims, 17 Drawing Sheets

US 8,681,561 B2

APPARATUSES AND METHODS INCLUDING MEMORY WRITE OPERATION

BACKGROUND

Memory devices, such as flash memory, are widely used in computers and many electronic products. Such memory devices have numerous memory cells. Information can be stored into the memory cells in a write operation. The stored information can be retrieved in a read operation or can be cleared in an erase operation. As memory cell density increases for a given device area, controlling operations in these devices may pose a challenge.

DETAILED DESCRIPTION

Figure 1:
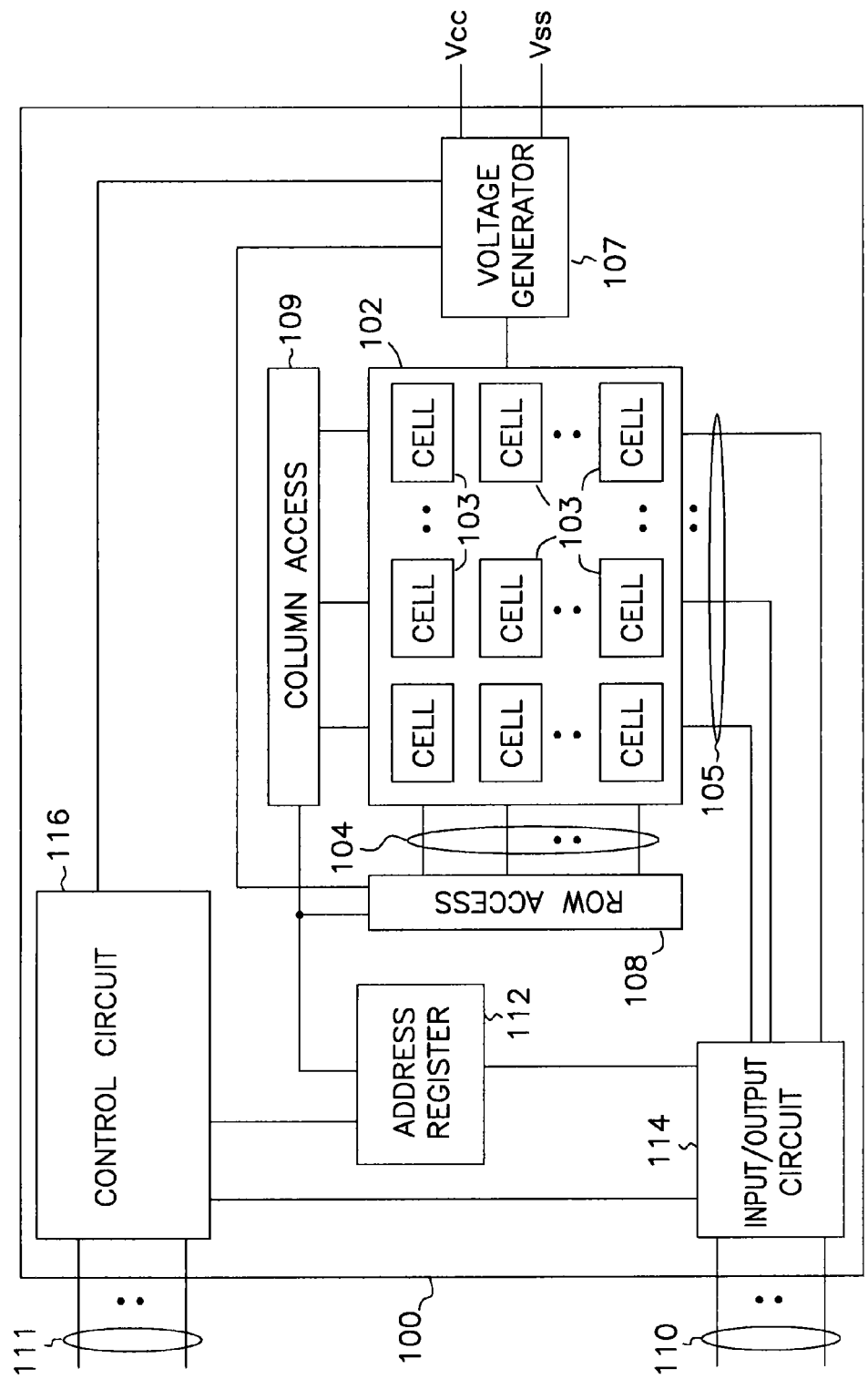
FIG. 1 shows a block diagram of a memory device according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access circuitry 109 can respond to an address register 112 to access memory cells 103 based on row address and column address signals on lines 110, 111, or both. A data input/output circuit 114 can be configured to exchange data between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase command) to memory device 100 using different combinations of signals on lines 110, 111, or both.

Memory device 100 can respond to commands to perform memory operations of accessing a memory cell(s), such as a read operation to read information from memory cells 103 and a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a voltage generator 107. Control circuit 116 (or parts thereof) and voltage generator 107 can be configured to generate different voltages for use during memory operations of memory device 100. For example, voltages generated by voltage generator 107 can be applied to lines 104 during a read or write operation to access memory cells 103. Voltage generator 107 and control circuit 116 (or parts thereof) can be referred to separately or together as a module to cause the application of different voltages to components (e.g., lines 104) of memory device 100.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

Memory device 100 may include memory devices and operate using memory operations (e.g., write operations) similar to or identical to memory devices and operations described below with reference to FIG. 2 through FIG. 15.

Figure 2:
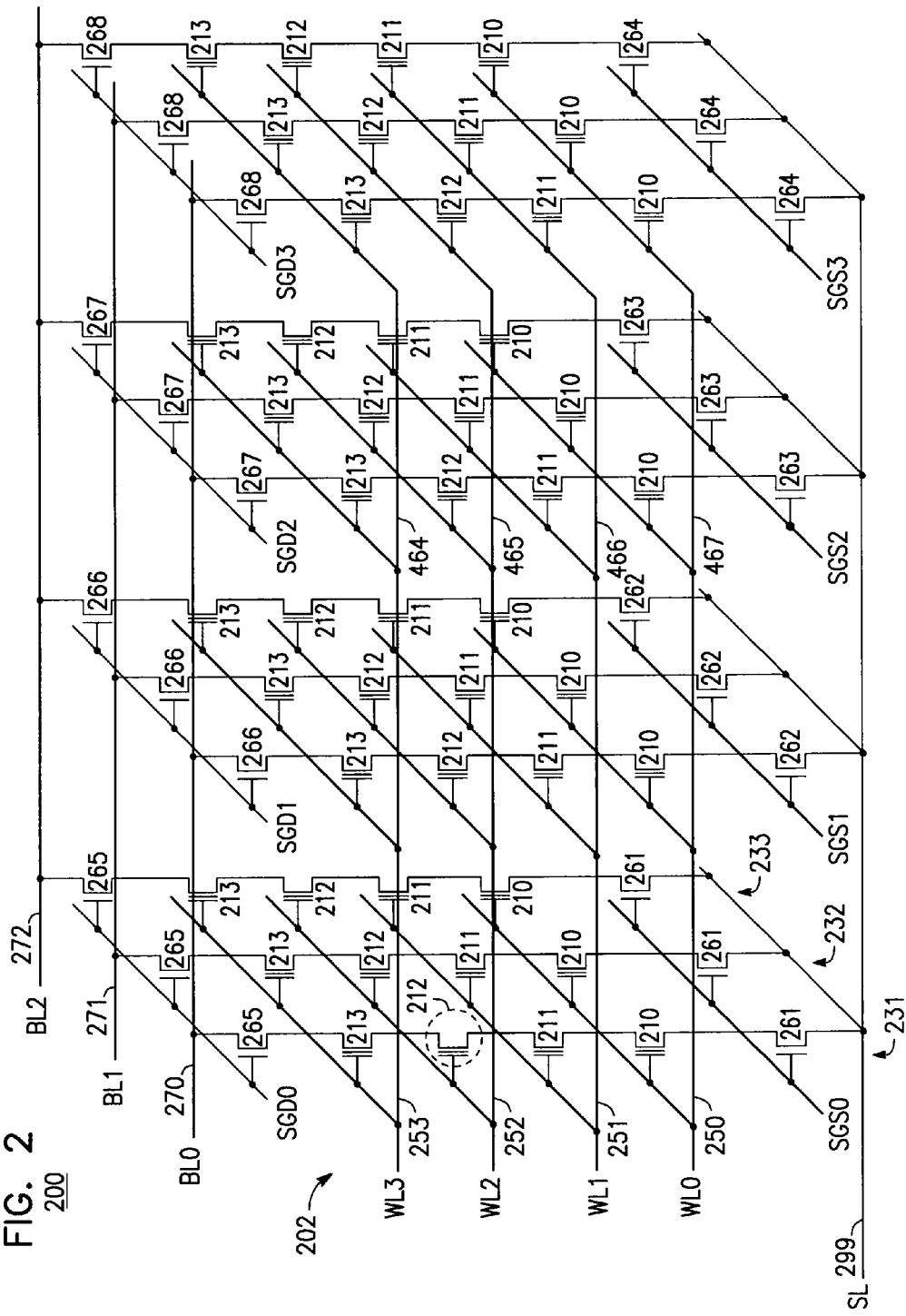
FIG. 2 shows a schematic diagram of a portion of a memory device having a memory array, according to an embodiment of the invention.

FIG. 2 shows a schematic diagram of a portion of a memory device 200 having a memory array 202, according to an embodiment of the invention. Memory device 200 can be associated with memory device 100 of FIG. 1, such as forming a portion of memory array 102 of memory device 100.

Memory device 200 can include lines 250, 251, 252, and 253 that can carry corresponding signals WL0, WL1, WL2, and WL3 WL2, and can form at least part of access lines of memory device 200. Lines 250, 251, 252, and 253 can correspond to lines 104 of FIG. 1. Memory device 200 can include lines 270, 271, and 272 that carry signals BL0, BL1, and BL2, respectively. Lines 270, 271, and 272 can correspond to lines 105 of FIG. 1. FIG. 2 shows four lines (e.g., access lines) 250, 251, 252, and 253 and three lines (e.g., data lines) 270, 271, and 272 as an example. The number of these lines can vary.

Memory device 200 can include memory cells 210, 211, 212, and 213, and transistors 261 through 268. These memory cells 210, 211, 212, and 213 and transistors 261 through 268 can be arranged in memory cell strings, such as memory cell strings 231, 232, and 233. For simplicity, in FIG. 2, only three of the memory cell strings are labeled (231, 232, and 233). FIG. 2 shows an example of nine memory cell strings and four memory cells 210, 211, 212, and 213 in each memory cell string. The number of memory cell strings and number of memory cells in each memory cell string can vary.

Memory cells 210, 211, 212, and 213 can be physically located in multiple levels of memory device 200, such that memory cells 210, 211, 212, and 213 in the same memory cell string can be stacked over each other in multiple levels of memory device 200.

As shown in FIG. 2, transistors 261 through 268 and can be controlled (e.g., turned on or turned off) by corresponding signals SGD0, SGD1, SGD2, and SGD3, and SGS0, SGS1, SGS2, and SGS3 to couple the memory cell strings to their respective lines 270, 271, and 272, and a line 299, during a memory operation, such as a write operation. Line 299 can include a source line of memory device 200 and can carry a signal, such as signal SL.

In a memory operation, such as a write operation, different voltages can be applied to lines 250, 251, 252, and 253 to selectively access memory cells 210, 211, 212, and 213 in order to store information into one or more selected memory cell among memory cells 210, 211, 212, and 213. For example, in a write operation, memory device 200 can select memory cell 212 (shown within a dashed circle) of memory cell string 231 to store information into memory cell 212. In this example, memory device 200 can apply a voltage to line 252 and other voltages to lines 250, 251, and 253. The voltage on lines 250, 251, and 253 can have the same or different values.

Memory device 200 can include memory devices and operate using memory operations (e.g., write operations) similar to or identical to memory devices and operations described below with reference to FIG. 3 through FIG. 15. For example, the different voltages applied to lines 250, 251, 252, and 253 during a write operation can be similar to or identical to voltages used during a write operation of memory devices described below with reference to FIG. 3 through FIG. 15.

Figure 3:
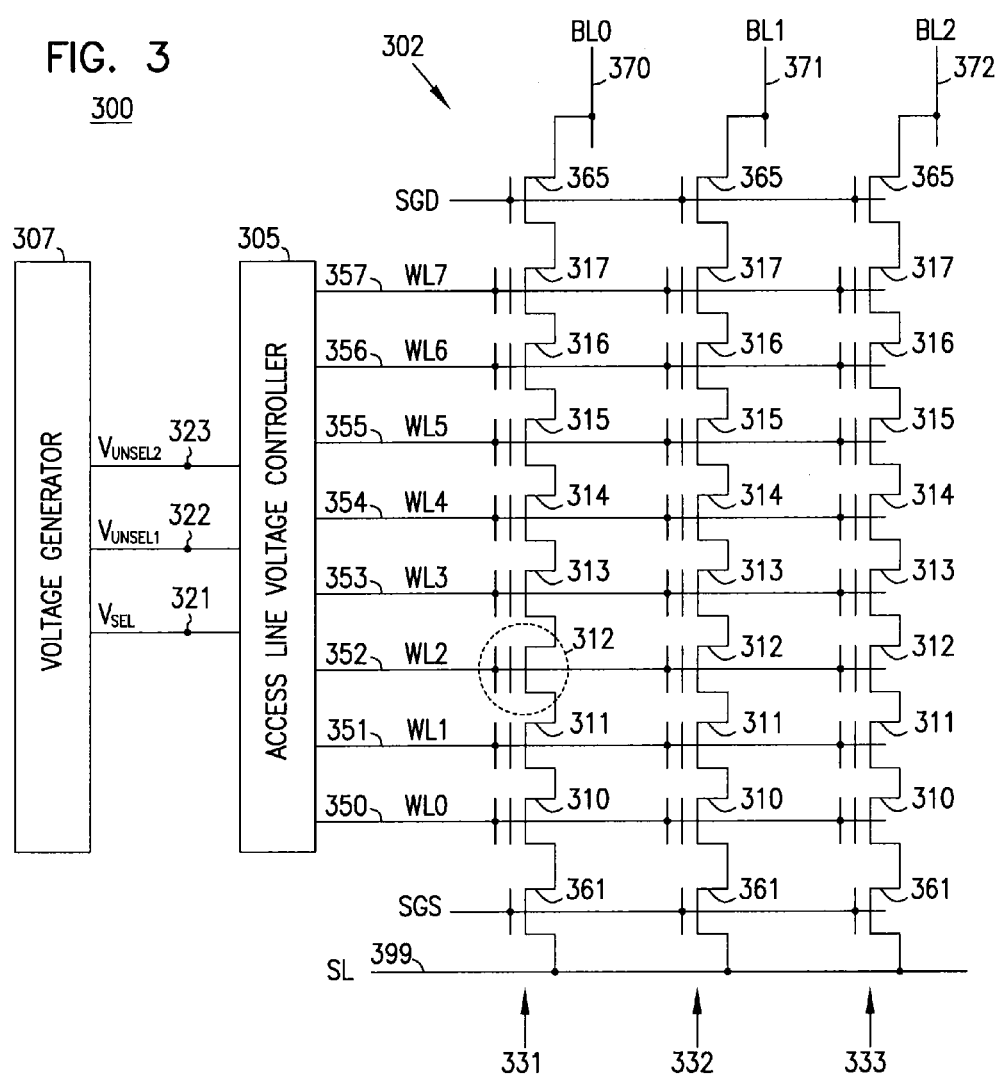
FIG. 3 shows a schematic diagram of a portion of a memory device including a memory array and an access line voltage controller, according to an embodiment of the invention.

FIG. 3 shows a schematic diagram of a portion of a memory device 300 including a memory array 302 and access line voltage controller 305, according to an embodiment of the invention. Memory device 300 can be associated with memory device 100 of FIG. 1 or memory device 200 of FIG. 2, such as forming a portion of memory array 102 (FIG. 1) or memory array 202 (FIG. 2).

As shown in FIG. 3, memory device 300 can include memory cells 310 through 317 and transistors 361 and 365 arranged in memory cell strings 331, 332, and 333, which are coupled to a line (e.g., source line) 399 and lines (e.g., data lines) 370, 371, and 372. Memory cell strings 331, 332, and 333 can correspond to memory cell strings 231, 232, and 233 of FIG. 2. Lines 370, 371, and 372 (and associated signal BL0, BL1, and BL2) of FIG. 3 can correspond to lines 270, 271, and 272, respectively, of FIG. 2. FIG. 3 shows an example of three lines 370, 371, and 372 with each having only one associated memory cell string. The number of lines and memory cell strings associated with each line can vary. FIG. 3 also shows an example of eight memory cells 210 through 217 in each memory cell string. The number of memory cells in each memory cell string can vary.

Memory device 300 can include lines 350 through 357, which can form part of access lines (e.g., local access lines) of memory device 300 to access memory cells 310 through 317 during a memory operation (e.g., read or write operation). Lines 350 through 357 can correspond to similar lines in FIG. 2. For example, lines 350, 351, 352, and 353 in FIG. 3 can correspond to lines 250, 251, 252, and 253, respectively, of FIG. 2. FIG. 3 shows an example of eight lines 350 through 357. The number of these lines can vary.

As shown in FIG. 3, each of lines 350 through 357 can be arranged with two adjacent lines. Lines adjacent to each other refer to lines that are physically located immediately next to each other. For example, lines 351 and 352 can be adjacent lines. Lines 352 and 353 can be adjacent lines. Thus, lines 351 and 352 are adjacent to line 352. Lines 350 and 354 through 357 can be nonadjacent (not adjacent) to line 352.

Memory device 300 can include a voltage generator 307 having nodes 321, 322, and 323 to provide different voltages in the form of signals $V_{SEL}$, $V_{UNSEL1}$, and $V_{UNSEL2}$, respectively.

Access line voltage controller 305 can selectively apply (e.g., couple) the voltages at nodes 321, 322, and 323 to lines 350 through 357 during a memory operation (e.g., a write operation) of memory device 300, depending on which of lines 350 through 357 is a selected line or unselected lines during the memory operation. For example, during a write operation, access line voltage controller 305 can apply the voltage at node 321 (associated with signal $V_{SEL}$) to a selected line among lines 350 through 357, the voltage at node 322

(associated with signal $V_{UNSEL1}$) to lines adjacent to the selected line, and the voltage at node 323 (associated with signal $V_{UNSEL2}$) to lines not adjacent to the selected line.

A selected line refers to a line (e.g., one of lines 350 through 357) that is associated with a selected memory cell (e.g., one of memory cells 310 through 317) during a memory operation. An unselected line refers to a line associated with unselected memory cells in which the unselected memory cells are not associated with the selected line.

A selected memory cell refers to a memory cell that is selected to be accessed in a memory operation (e.g., read or write operation); for example, such that the memory device (e.g., memory device 300) can sense (e.g., read) information stored in the selected memory cell (e.g., in a read operation) or store (e.g., write) information into the selected memory cell (e.g., in a write operation). An unselected memory cell refers to a memory cell that is not selected to be accessed during a memory operation. A selected memory cell string refers to a memory cell string that is associated with a selected memory cell.

In the following description of an example of a write operation associated with FIG. 3 through FIG. 7, memory cell 312 (shown within a dashed circle) of memory cell string 331 in FIG. 3 is assumed to be a selected memory cell and memory cell string 331 is a selected memory cell string. Thus, in this example, line 352 (associated with memory cell 312) is a selected line. Lines 351 and 353 are unselected and adjacent to line 352. Lines 350 and 354 through 357 are unselected and not adjacent to line 352. In this example, access line voltage controller 305 can apply the voltage at node 321 to line 352, apply the voltage at node 322 to lines 351 and 353, and apply the voltage at node 323 to lines 350 and 354 through 357.

Figure 4:
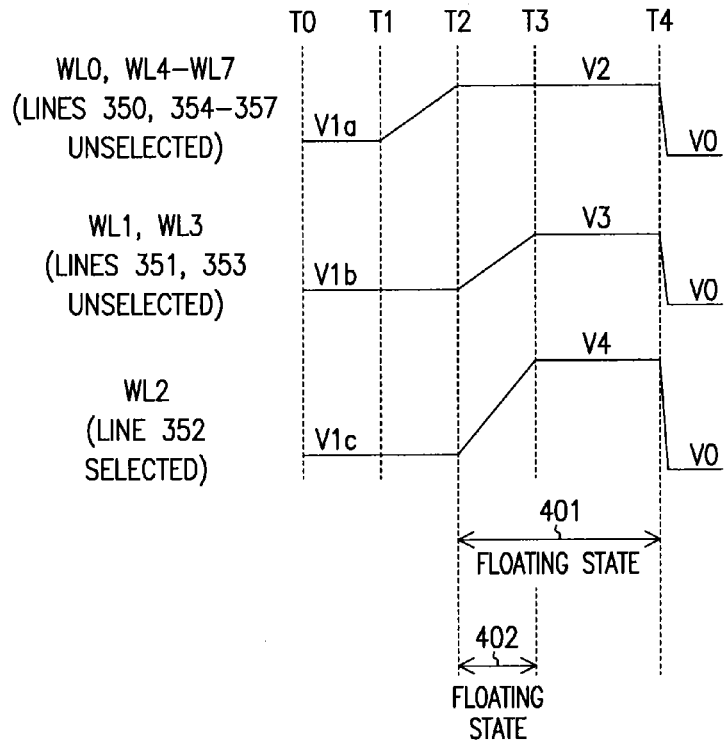
FIG. 4 is an example timing diagram for signals associated with access lines of the memory device of FIG. 3 during a memory operation, according to an embodiment of the invention.

FIG. 4 is an example timing diagram for signals WL0 through WL7 associated with lines 350 through 357 of FIG. 3 during a memory operation, according to an embodiment of the invention. In FIG. 4, T0 through T4 represent different times during a write operation. V0, V1a, V1b, V1c, V2, V3, and V4 represent different voltages (e.g., levels) associated with signals WL0 through WL7.

Voltage V0 can be approximately zero volts (e.g. ground potential). Each of voltages V1a, V1b, V1c, V2, V3, and V4 can have a positive value. Voltage V1c can be greater than each of voltages V1a and V1b. Voltages V1a and V1b can have the same or different values. Voltages V2 and V3 can have the same or different values. Voltage V4 can be greater than each of voltages V2 and V3.

Each of voltages V1a and V1b can have an example value equal to a supply voltage (e.g., Vcc) of memory device 300. For example, each of voltages V1a and V1b can have a value of approximately three volts if the supply voltage of memory device 300 is approximately three volts. Other positive voltage can be used. Each of voltages V1c, V2, V3, and V4 can have an example value greater a supply voltage (e.g., Vcc) of memory device 300. For example, voltage V1c can have a value of approximately 13 volts. Each of voltages V2 and V3 can have a value of approximately 10 volts. Voltage V4 can be a programming voltage and can have a value of approximately 20 volts.

The relationship among voltages V1c, V2, V3, and V4 can be based on the expression (1) below.

$$V1c=V4-Vn+Vm \quad (1)$$

In expression (1), Vn can be replaced by either V2 or V3. Vm can be replaced by either V1a or V1b.

The following description refers to FIG. 3 and FIG. 4.

Memory device 300 of FIG. 3 can use voltages V2 and V3 (FIG. 4) to turn on transistors in unselected memory cells 310, 311, and 313 through 317 of memory cell string 331 (FIG. 3), regardless of the values of information stored in these unselected memory cells. Under this condition, unselected memory cells 310, 311, and 313 through 317 of memory cell string 331 in this example can operate as pass elements (e.g., transistors) during a write operation to store information into memory cell 312 of memory cell string 331. Memory device 300 can use voltage V4 to store (e.g., write) information into memory cell 312 during a time interval between times T3 and T4. The information stored in memory cell 312 can represent a value of a fraction of a bit, a value of a single bit, or a value of multiple bits such as two, three, four, or another number of bits. After information is stored in memory cell 312 (e.g., after time T4), memory device 300 can couple lines 350 through 357 to voltage V0, for example by allowing lines 351 through 357 to discharge to ground.

As shown in FIG. 4, lines 350 and 354 through 357 (not adjacent to selected line 352) can be applied with voltage V1a during a time interval between times T0 and T1. At time T1, the voltage on lines 350 and 354 through 357 can start to change (e.g., increase) and can reach a voltage V2 at time T2. During a time interval between times T2 and T4, the voltage on lines 350 and 354 through 357 can remain at voltage V2. At time T4, the voltage on lines 350 and 354 through 357 can start to change again (e.g., decrease) and can reach a voltage V0 at some time after time T4.

Lines 351 and 353 (adjacent to selected line 352) can be applied with voltage V1b during a time interval between times T0 and T2. At time T2, the voltage on lines 351 and 353 can start to change (e.g., increase) and can reach a voltage V3 at time T3. During a time interval between times T3 and T4, the voltage on lines 351 and 353 can remain at voltage V3. At time T4, the voltage on lines 351 and 353 can start to change again (e.g., decrease) and can reach a voltage V0 at some time after time T4.

Line 352 (selected line) can be applied with voltage V1c during a time interval between times T0 and T2. At time T2, the voltage on line 352 can start to change (e.g., increase) and can reach a voltage V4 at time T3. During a time interval between times T3 and T4, the voltage on line 352 can remain at voltage V4. At time T4, the voltage on line 352 can start to change again (e.g., decrease) and can reach a voltage V0 at some time after time T4.

Line 352 can be placed in a floating state during at least a portion of a time interval within the write operation. Placing line 352 in a floating state can include decoupling line 352 from one node (e.g., node that provides a voltage) during a time interval and not coupling line 352 to another node during that same time interval.

For example, line 352 can be placed in floating state 401 (FIG. 4), which can occur during an entire time interval between times T2 and T4. In floating state 401, line 352 can be decoupled from a node (e.g., node 321 in FIG. 3 that can provide voltage V1c) during a time interval between times T2 and T4 and not coupling line 352 to another node during the same time interval between times T2 and T4. Thus, in floating state 401, a voltage is not applied to line 352 during a time interval between times T2 and T4.

In another example, line 352 can be placed in a floating state 402, which can occur during only a portion (between times T2 and T3) of a time interval between times T2 and T4. In floating state 402, line 352 can be decoupled from a node (e.g., node 321 in FIG. 3 that can provide voltage V1c) during a time interval between times T2 and T3 and not coupled to another node during the same time interval between times T2 and T3. Thus, in floating state 402, a voltage is not applied to line 352 during a time interval between times T2 and T3. At time T4, line 352 can be coupled to a node that provides a voltage, such as node 321 in FIG. 3 that can provide voltage V4 at time T4.

As shown in FIG. 4, although line 352 can be placed in either floating state 401 or 402, the voltage on line 352 can still increase from voltage V1c at time T2 to voltage V4 at time T3. The voltage increase can be attributed to coupling capacitances between line 352 and each of adjacent lines 351 and 353.

As shown in FIG. 3, lines 351 and 353 are adjacent to line 352. Thus, a coupling capacitance can exist between lines 352 and 351 and another coupling capacitance can exist between lines 352 and 353. In memory device 300, each of these two coupling capacitances can have a value of approximately 100 pF (picofarads). During a write operation, although line 352 can be placed in a floating state 401 or 402 (FIG. 4), the coupling capacitances from adjacent lines 351 and 353 can cause the voltage on line 352 to change (e.g., increase) in the same direction that the voltage on lines 351 and 352 change.

As shown in FIG. 4, the voltage on lines 351 and 353 can increase from voltage V1b at time T2 to voltage V3 at time T3. Thus, due to the coupling capacitances from adjacent lines 351 and 353, the voltage on line 352 can also increase from voltage V1c at time T2 to a higher voltage, such as voltage V4 at time T3.

Placing a selected line, such as line 352 in the above example, in a floating state (e.g., floating state 401 or 402) during a write operation can reduce power consumption of memory device 300 because part of the power (e.g., voltage V4) can be contributed by coupling capacitances from lines adjacent to the selected line. Placing a selected line in a floating state can also shorten a time that memory device 300 generates a voltage (e.g., voltage V4) to program a selected memory cell because a selected line in a floating state (e.g., floating state 402) can reduce a load from a node that provides such voltage.

The description of an example write operation associated above with reference to FIG. 3 and FIG. 4 assumes that memory cell 312 is a selected memory cell. Similar operations can be applied to other memory cells among memory cells 310 through 317. For example, if memory cell 314 of memory cell string 331 is a selected memory cell during a write operation, then line 354 can be a selected line, lines 353 and 355 can be unselected lines adjacent to line 354, and lines 350, 351, 352, 356, and 357 can be unselected lines not adjacent to line 354. In such an example, during a write operation, line 354 can have voltages V1c, V4, and V0, as shown in FIG. 4. Lines 353 and 355 can have voltages V1b, V3, and V0, as shown in FIG. 4. Lines 350, 351, 352, 356, and 357 can have voltages V1a, V2, and V0, as shown in FIG. 4.

Figure 5:
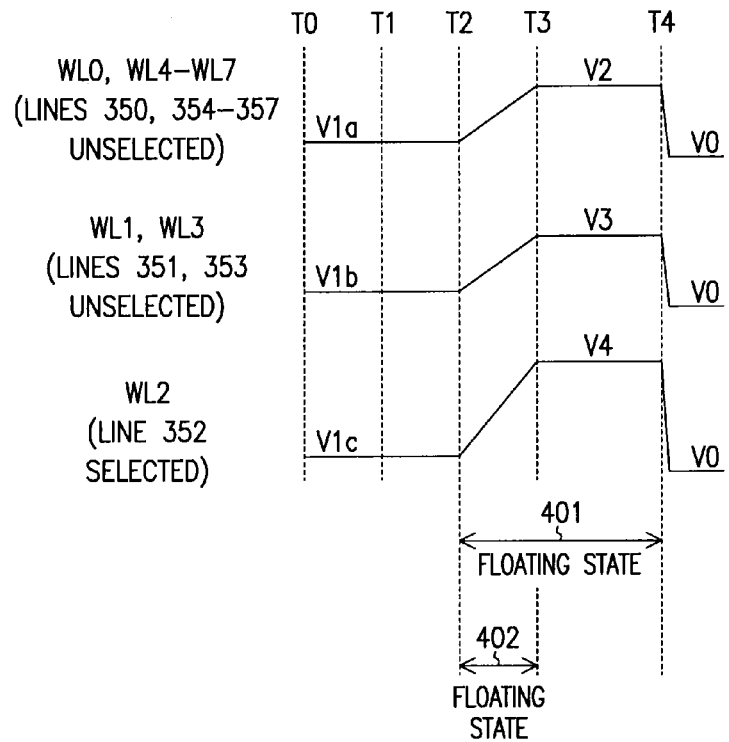
FIG. 5 is an example variation of the timing diagram of FIG. 4, according to an embodiment of the invention.

FIG. 5 is an example variation of the timing diagram of FIG. 4, according to an embodiment of the invention. For simplicity, detailed description of the same elements between FIG. 4 and FIG. 5 is not repeated in the description of FIG. 5. As shown in FIG. 5, voltage V1a on lines 350 and 354 through 357 can start to change at time T2, which is the same (or substantially the same) time that voltage V1b on lines 351 and 353 start to change. In FIG. 4, voltages V1a and V1b change at different times (T1 and T2).

Figure 6:
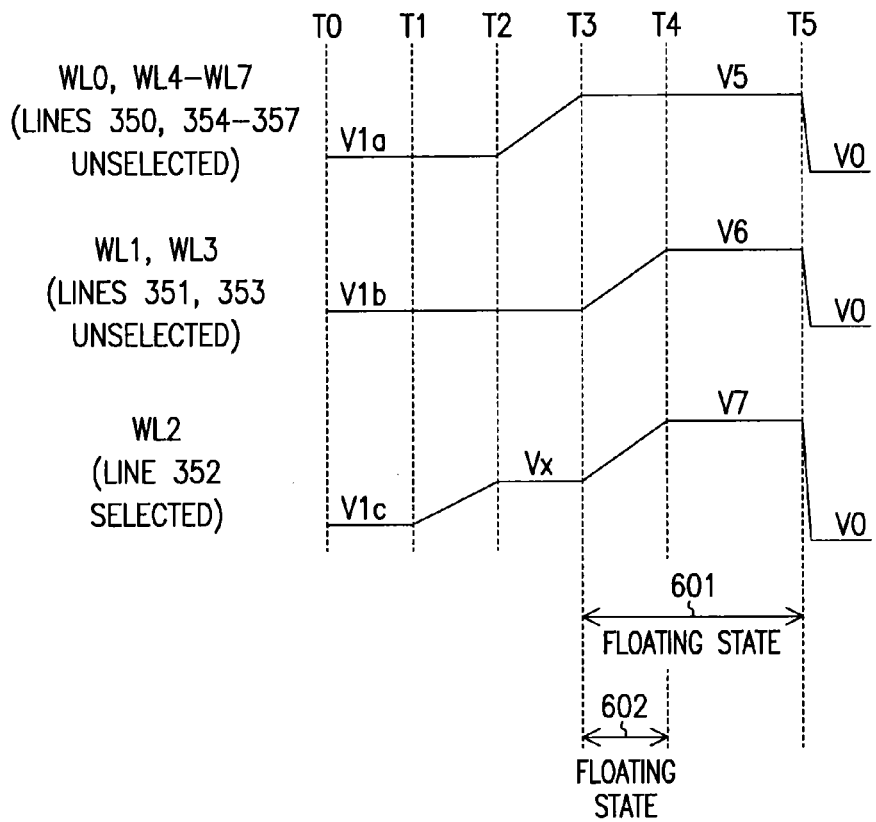
FIG. 6 is an example timing diagram for signals on access lines of the memory device of FIG. 3 during a memory operation, including an intermediate voltage, according to an embodiment of the invention.

FIG. 6 is an example timing diagram for signals WL0 through WL7 on lines 350 through 357, respectively, of FIG. 3 during a memory operation, in which line 352 can have an intermediate voltage Vx, according to an embodiment of the invention. In FIG. 4, T0 through T5 represent different times during a write operation. V0, V1a, V1b, V1c, Vx, V5, V6, and V7 represent different voltages (e.g., signal levels) associated with signals WL0 through WL7 on lines 350 through 357, respectively.

Voltage V0 can be approximately zero volts (e.g., ground potential). Each of voltages V1a, V1b, V1c, Vx, V5, V6, and V7 can have a positive value. Voltage V1c can be greater than each of voltages V1a and V1b. Voltages V1a and V1b can have the same or different values. Voltages V5 and V6 can have the same or different values. Voltage V7 can be greater than each of voltages V5 and V6. Voltage Vx is less than voltage V7 and can be greater than voltage V6.

Each of voltages V1a, V1b, and V1c can have an example value equal to a supply voltage (e.g., Vcc) of memory device 300. For example, each of voltages V1a, V1b, and V1c can have a value of approximately three volts if the supply voltage of memory device 300 is approximately three volts. Other positive voltage can be used. Each of voltages V1c, Vx, V5, V6, and V7 can have an example value equal to or greater than a supply voltage (e.g., Vcc) of memory device 300. For example, voltage V1c can have a value of approximately three volts (e.g., Vcc). Voltage Vx can have a value of approximately 13 volts. Each of voltages V5 and V6 can have a value of approximately 10 volts. Voltage V7 can be a programming voltage and can have a value of approximately 20 volts.

The relationship among voltages V1a, V1b, V1c, Vx, V5, V6, and V7 can be based on the expression (2) below.

$$Vx = V7 - Vj + V1 \quad (2)$$

In expression (2), Vj can be replaced by either V5 or V6. V1 can be replaced by V1a, V1b, or V1c.

The following description refers to FIG. 3 and FIG. 6.

Memory device 300 (FIG. 3) can use voltages V5 and V6 to turn on transistors in unselected memory cells (e.g., 310, 311, and 313 through 317) of the selected memory cell string (e.g., string 321) to enable the unselected memory cells to operate as pass elements. Memory device 300 can use voltage V7 to store (e.g., write) information into the selected memory cell (cell 312) during a time interval between times T4 and T5.

As shown in FIG. 6, lines 350 and 354 through 357 (not adjacent to selected line 352) can be applied with voltage V1a during a time interval between times T0 and T2. At time T2, the voltage on lines 350 and 354 through 357 can start to change (e.g., increase) and can reach a voltage V5 at time T3. During a time interval between times T3 and T5, the voltage on lines 350 and 354 through 357 can remain at voltage V5. At time T4, the voltage on lines 350 and 354 through 357 can start to change again (e.g., decrease) and can reach a voltage V0 at some time after time T5.

Lines 351 and 353 (adjacent to selected line 352) can be applied with voltage V1b during a time interval between times T0 and T3. At time T3, the voltage on lines 351 and 353 can start to change (e.g., increase) and can reach a voltage V6 at time T4. During a time interval between times T4 and T5, the voltage on lines 351 and 353 can remain at voltage V6. At time T5, the voltage on lines 351 and 353 can start to change again (e.g., decrease) and can reach a voltage V0 at some time after time T5.

Line 352 (selected line) can be applied with voltage V1c during a time interval between times T0 and T1. At time T1, the voltage on line 352 can start to change (e.g., increase) and can reach a voltage Vx at time T2. During a time interval between times T2 and T3, the voltage on line 352 can remain at voltage Vx. At time T3, the voltage on line 352 can start to change again (e.g., increase) and can reach a voltage V7 at time T4. During a time interval between times T4 and T5, the voltage on line 352 can remain at voltage V7. At time T5, the voltage on line 352 can start to change again (e.g., decrease) and can reach a voltage V0 at some time after time T5.

As shown in FIG. 6, line 352 can be placed in either floating state 601 or 602 during at least a portion of a time interval within the write operation. For example, line 352 can be placed in floating state 601 during a time interval between times T3 and T5. In another example, line 352 can be placed in floating state 602 during only a portion (between times T3 and T4) of a time interval between times T3 and T5.

Figure 7:
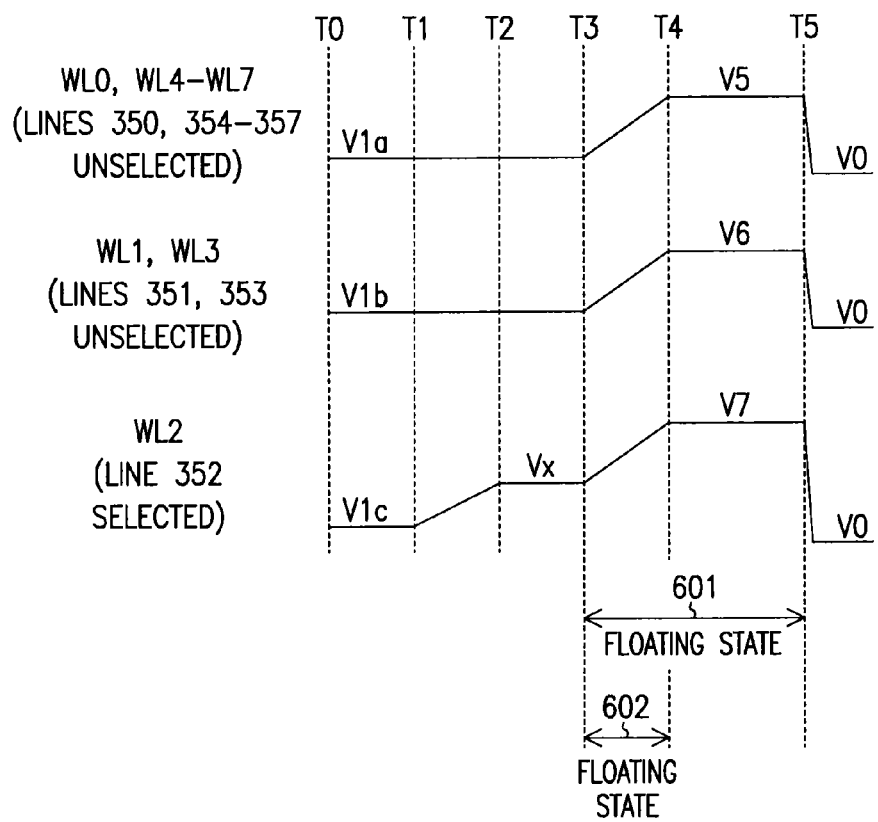
FIG. 7 is an example variation of the timing diagram of FIG. 6, according to an embodiment of the invention.

FIG. 7 is an example variation of the timing diagram of FIG. 6, according to an embodiment of the invention. For simplicity, detailed description of the same elements between FIG. 6 and FIG. 7 is not repeated in the description of FIG. 7. As shown in FIG. 7, voltage V1$a$ on lines 350 and 354 through 357 can start to change at time T3, which is the same (or substantially the same) time that voltage V1$b$ on lines 351 and 353 start to change. In FIG. 6, voltages V1$a$ and V1$b$ change at different times (T1 and T2).

Figure 8:
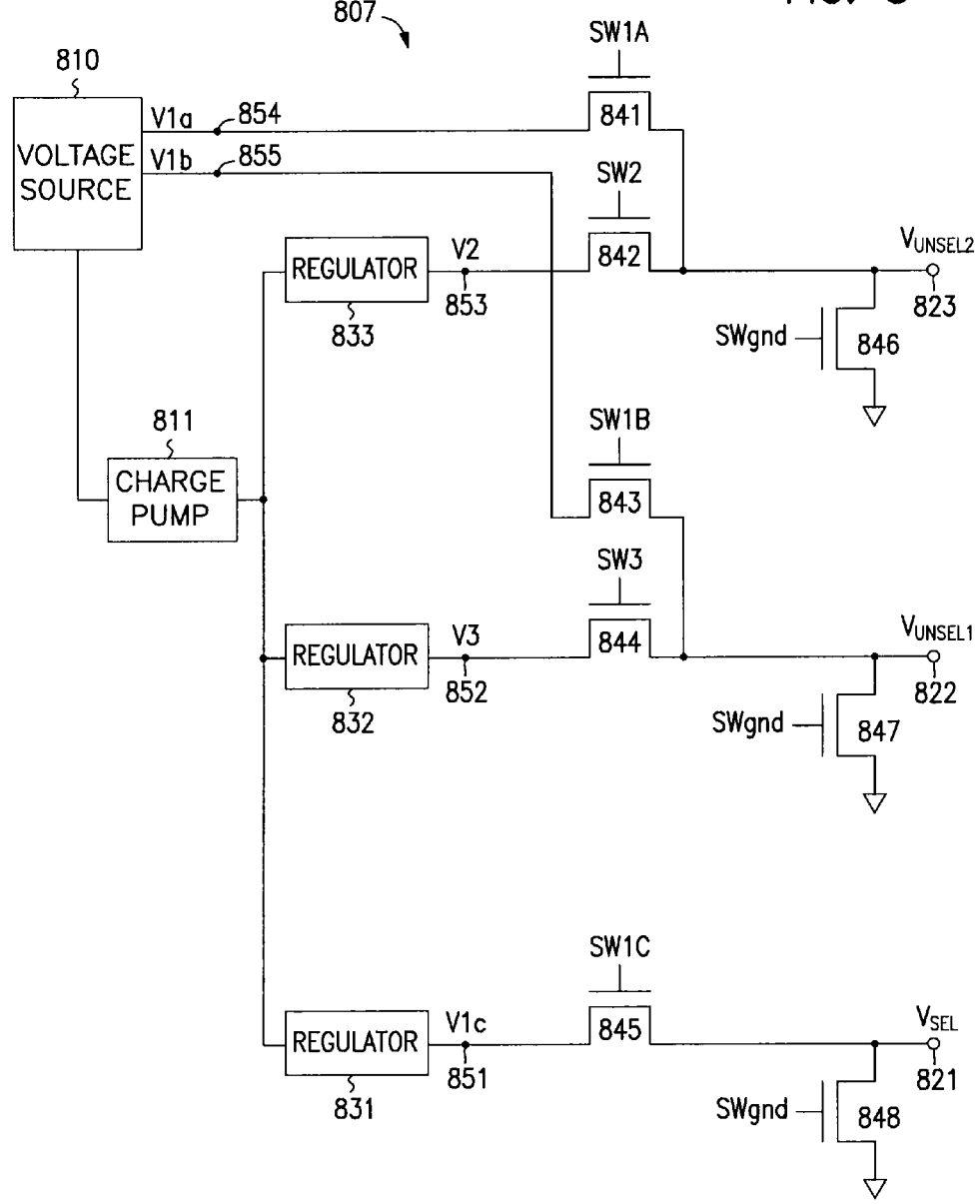
FIG. 8 shows a schematic diagram of a voltage generator, according to an embodiment of the invention.

FIG. 8 shows a schematic diagram of a voltage generator 807, according to an embodiment of the invention. Voltage generator 807 can be included in a memory device, such as memory device 100 (FIG. 1), 200 (FIG. 2), or 300 (FIG. 3). For example, voltage generator 807 can form part of voltage generator 107 of FIG. 1 or voltage generator 307 of FIG. 3.

In FIG. 8, voltage generator 807 can include a voltage source 810, a charge pump 811, regulators 831, 832, and 833, and switches 841 through 848. Voltage generator 807 can include nodes 854 and 855 to provide corresponding voltages V1$a$, V1$b$, V1$c$, V2, and V3.

In FIG. 8, voltage source 810 can include a supply voltage, such as a supply voltage (e.g., Vcc) of a memory device associated with voltage generator 807. Voltage source 810 can be configured to generate voltages V1$a$ and V1$b$.

Charge pump 811 can be configured to receive a voltage (e.g., Vcc) from voltage source 810 and generate one or more voltages (e.g., pumped voltages), such as voltages V1$c$, V2, and V3 that can be equal to or greater than the voltage from voltage source 810. For example, voltage source 810 can include a voltage of approximately three volts, and charge pump 811 can generate pumped voltages from approximately three volts to approximately 20 volts or greater.

Regulators 831, 832, and 833 can be configured to provide voltages V1$c$, V3, and V2 at nodes 851, 852, and 852, respectively.

Each of switches 841 through 848 can include only a single transistor having a gate controlled by one of signals SW1A, SW1B, SW1C, SW2, SW3, and SWgnd. In response to these signals, switches 841 through 848 can couple voltages V1$a$, V1$b$, V1$c$, V2, and V3 from corresponding nodes 851 through 855 to nodes 821, 822, and 823 in the forms of signals (e.g., voltage signals) $V_{SEL}$, $V_{UNSEL1}$, and $V_{UNSEL2}$, respectively.

Figure 9:
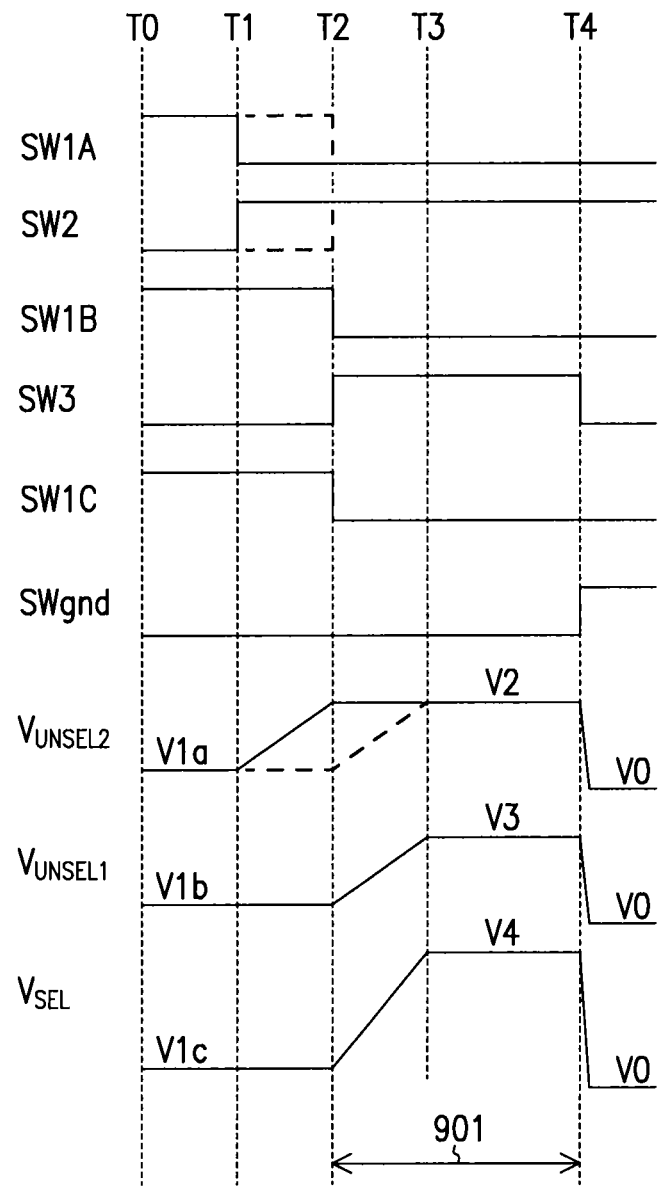
FIG. 9 is an example timing diagram for some signals of FIG. 8 during a memory operation, according to an embodiment of the invention.

FIG. 9 is an example timing diagram for some signals of FIG. 8 during a memory operation, according to an embodiment of the invention. As shown in FIG. 9, each of signals SW1A, SW1B, SW1C, SW2, SW3, and SWgnd can have different levels (e.g., high and low levels) at different times among times T0, T1, T2, T3, and T4. A high level can correspond to a positive voltage (e.g., Vcc). A low level can correspond to voltage of approximately zero volts. In FIG. 9, based on the level of these signals, switches 841 through 845 (FIG. 8) can turn on or off to selectively couple nodes 821, 822, and 823 to voltages V1$a$, V1$b$, V1$c$, V2 and V3. Switches 846, 847, and 848 can couple nodes 821, 822, and 823 to a ground potential at time T4, e.g., after information is stored into a selected memory cell during a time interval between times T3 and T4. The following description refers to FIG. 8 and FIG. 9.

As shown in FIG. 9, signals SW1A and SW2 can have opposite levels from each other. Switches 841 and 842 can turn on or off in response to signals SW1A and SW2, respectively, and couple voltages V1$a$ and V2 to node 823 at different times in the form of signal $V_{UNSEL2}$. For example, signal SW1A can have one level (e.g., high) between times T0 and T1 and another level (e.g., low) between times T1 and T4. Based on signal SW1A, switch 841 can turn on between times T0 and time T1 and couple node 823 to voltage V1$a$ at node 854. Switch 841 can turn off between times T1 to time T4 and decouple node 823 from voltage V1$a$. Based on signal SW2, switch 842 can turn off between times T0 and time T1 and decouple node 823 from voltage V2 at node 853. Switch 842 can turn on between times T1 to time T4 and couple node 823 to voltage V2.

Signals SW1B and SW3 can have opposite levels from each other. Switches 843 and 844 can turn on or off in response to signals SW1B and SW3, respectively, and couple voltages V1$b$ and V3 to node 822 at different times in the form of signal $V_{UNSEL1}$. For example, signal SW1B can have one level (e.g., high) between times T0 and T2 and another level (e.g., low) between times T2 and T4. Based on signal SW1B, switch 843 can turn on between times T0 to time T2 and couple node 822 to voltage V1$b$ at node 855. Switch 843 can turn off between times T2 to time T4 and decouple node 822 from voltage V1$b$. Based on signal SW3, switch 844 can turn off between times T0 to time T2 and decouple node 822 from voltage V3 at node 853. Switch 844 can turn on between times T2 to time T4 and couple node 822 to voltage V3.

Signal SW1C (FIG. 9) can have one level (e.g., high) between times T0 and T2 and another level (e.g., low) between times T2 and T4. Switch 845 can turn on or off in response to signal SW1C and couple voltage V1$c$ to node 821 in the form of signal $V_{SEL}$. For example, switch 845 can turn on between times T0 and T2 and couple node 821 to voltage V1$c$ at node 851. Switch 845 can turn off between times T2 and time T4 and decouple node 821 from voltage V1$c$.

Although node 821 can be decoupled from node 851 at time T2, the voltage on node 821 can increase from voltage V1$c$ to voltage V4, as shown in FIG. 9. This can occur if node 821 is coupled to a selected line during a time interval 901 (between times T2 and T4) and the selected line is placed in a floating state during the same time interval (e.g., time interval 901). As described above with reference to FIG. 3 and FIG. 4, due to coupling capacitances, the voltage on a selected line (e.g., line 352) can increase when the selected line is placed in a floating state. In FIG. 9, an increase from voltage V1$c$ to voltage V4 during time interval 901 can be attributed to coupling capacitances associated with the selected line during time interval 901. If node 821 is not coupled to a selected line during time interval 901, node 821 can remain at voltage V1$c$ from time T2 to time T4.

In FIG. 9, dashed portions associated with signals SW1A, SW2, $V_{UNSEL2}$ represent a variation for these signals. In such a variation, the dashed portions can replace their respective solid portions. For example, instead of changing between levels (e.g., between high and lows) at time T1, signals SW1A and SW2 can change between levels at time T2, as indicated by the dashed portion associated with signals SW1A and SW2. In this example, signal $V_{UNSEL2}$ can also change accordingly. For example, instead of changing from voltage V1$a$ to voltage V2 between times T1 and T2, signal $V_{UNSEL2}$ can change from voltage V1$a$ to voltage V2 between times T2 and T3, as indicated by the dashed portion associated with signal $V_{UNSEL2}$ between times T2 and T3.

Voltage generator 807 in FIG. 8 can be part of voltage generator 307 of memory device 300 in FIG. 3, such that voltages V1a, V1b, V1c, V2 and V3 on lines 350 through 357 in FIG. 4 can be applied from the same voltages V1a (solid portion in FIG. 9), V1b, V1c, V2 (solid portion in FIG. 9) and V3 generated by voltage generator 807 in FIG. 8. Time interval 901 between times T2 and T4 in FIG. 9 can correspond to a time interval between times T2 and T4 of FIG. 4.

Voltage generator 807 in FIG. 8 can be part of voltage generator 307 of memory device 300 in FIG. 3, such that voltages V1a, V1b, V1c, V2 and V3 on lines 350 through 357 in FIG. 5 can be applied from the same voltages V1a (dashed portion in FIG. 9), V1b, V1c, V2 (dashed portion in FIG. 9) and V3 generated by voltage generator 807 in FIG. 8. Time interval 901 between times T2 and T4 in FIG. 9 can correspond to a time interval between times T2 and T4 of FIG. 5.

Figure 10:
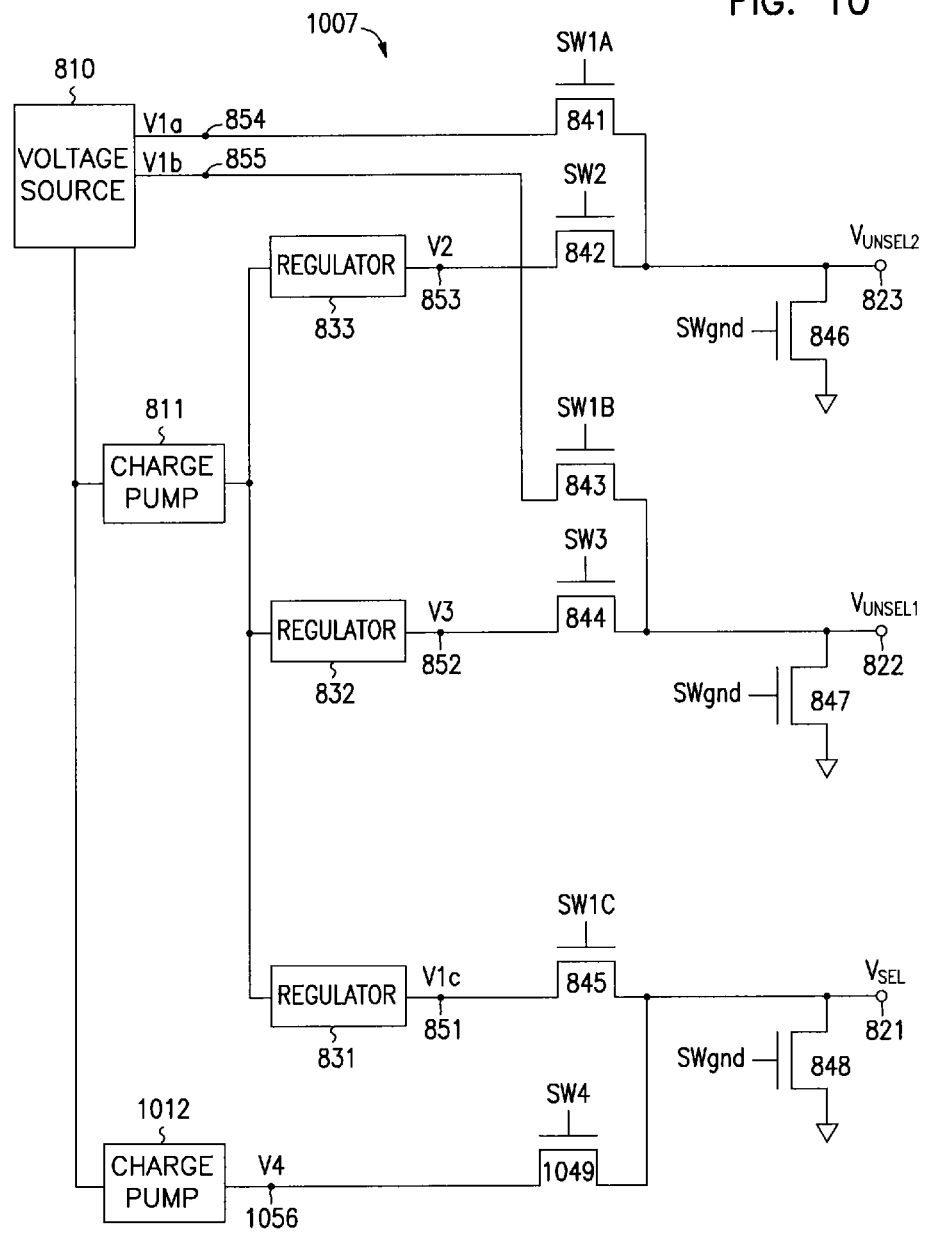
FIG. 10 shows a schematic diagram of a voltage generator having two charge pumps, according to an embodiment of the invention.

FIG. 10 shows a schematic diagram of a voltage generator 1007 having two charge pumps 811 and 1012, according to an embodiment of the invention. Voltage generator 1007 can include elements similar to or identical to those of voltage generator 807 of FIG. 8. Such elements are given the same designation labels. For simplicity, detailed description of similar or identical elements between FIG. 8 and FIG. 10 is not repeated in the description of FIG. 10.

As shown in FIG. 10, charge pump 1012 can generate a voltage V4 at node 1056. Voltage generator 1007 can include a switch 1049 that can respond to a signal SW4 and selectively couple node 821 to node 1056 to provide voltage V4 to node 821.

Each of charge pumps 811 and 1012 can include a number of stages (e.g., pumping stage) where the stages can provide voltages of different values. In each of charge pumps 811 and 1012, a maximum value of a voltage generated by the charge pump can be proportional to the number of the stages of the charge pump. Charge pump 1012 can include a greater number of stages than charge pump 811. Thus, charge pump 1012 can generate a voltage having a value (e.g., maximum value) greater than the values of voltages in charge pumps 811. For example, voltage V4 (FIG. 4) can have a value greater than a value of each of voltages V1c, V2, and V3.

Figure 11:
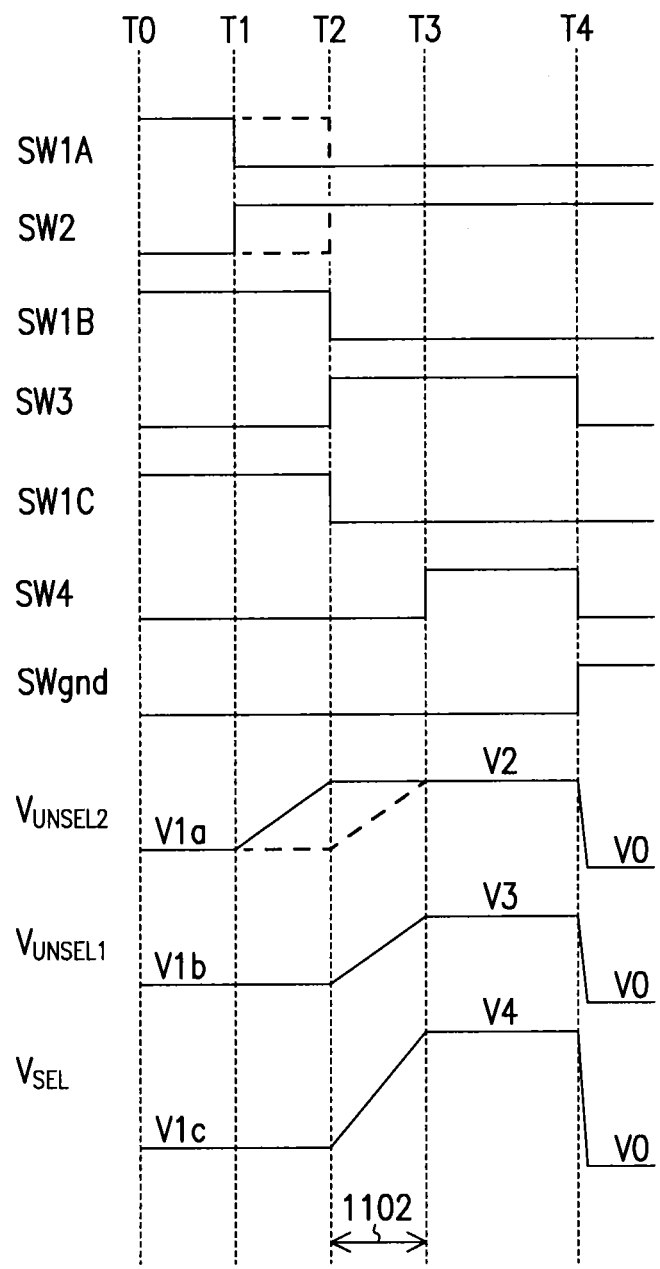
FIG. 11 is an example timing diagram for some signals of FIG. 10 during a memory operation, according to an embodiment of the invention.

FIG. 11 is an example timing diagram for some signals of FIG. 10 during a memory operation, according to an embodiment of the invention. FIG. 11 includes elements (e.g., signals) similar to or identical to those of FIG. 9. For simplicity, detailed description of similar or identical elements between FIG. 9 and FIG. 11 is not repeated in the description of FIG. 11. The following description refers to FIG. 10 and FIG. 11.

In FIG. 11, signal SW4 can have one level (e.g., low) between times T0 and T3 and another level (e.g., high) between times T3 and T4. Switch 1049 can turn on or off in response to signal SW4 and selectively couple voltage V4 to node 821. For example, switch 845 can turn off between times T0 to time T3 and decouple node 821 from voltage V4 at node 1056. Switch 845 can turn on between times T3 to time T4 and couple node 821 to voltage V4.

As shown in FIG. 11, between times T2 and T3, signal SW1C can have a level (e.g., low) such that switch 845 (FIG. 10) can also turn off. Thus, between times T3 and T4, both switches 845 and 1049 can turn off to decouple node 821 from nodes 851 and 1056. Thus, between times T3 and T4, node 821 can be decoupled from nodes 851 and 1056.

Although node 821 can be decoupled from nodes 851 and 1056 between times T3 and T4, the voltage on node 821 can increase from voltage V1c to voltage V4, as shown in FIG. 11. This can occur if node 821 is coupled to a selected line during a time interval 1102 (between times T2 and T3) and the selected line is placed in a floating state during the same time interval (e.g., time interval 1102). As described above with reference to FIG. 3 and FIG. 4, due to coupling capacitances, the voltage on a selected line (e.g., line 352) can increase when the selected line is placed in a floating state. In FIG. 11, an increase from voltage V1c to voltage V4 during time interval 1102 can be attributed to coupling capacitances associated with the selected line during time interval 1102. If node 821 (FIG. 10) is not coupled to a selected line during time interval 1102, node 821 can remain at voltage V1c from between times T3 and T4.

In FIG. 11, dashed portions associated with signals SW1A, SW2, $V_{UNSEL2}$ represent a variation for these signals, as described above with reference to FIG. 9.

Voltage generator 1007 in FIG. 10 can be part of voltage generator 307 of memory device 300 in FIG. 3, such that voltages V1a, V1b, V1c, V2, V3, and V4 on lines 350 through 357 in FIG. 4 can be applied from the same voltages V1a (solid portion in FIG. 11), V1b, V1c, V2 (solid portion in FIG. 11), V3, and V4 generated by voltage generator 1007 in FIG. 10. Time interval 1102 between times T2 and T3 in FIG. 11 can correspond to a time interval between times T2 and T3 of FIG. 4.

Voltage generator 1007 in FIG. 10 can be part of voltage generator 307 of memory device 300 in FIG. 3, such that voltages V1a, V1b, V1c, V2, V3, and V4 on lines 350 through 357 in FIG. 5 can be applied from the same voltages V1a (dashed portion in FIG. 11), V1b, V1c, V2 (dashed portion in FIG. 11), V3, and V4 generated by voltage generator 1007 in FIG. 10. Time interval 1102 between times T2 and T3 in FIG. 11 can correspond to a time interval between times T2 and T3 of FIG. 5.

Figure 12:
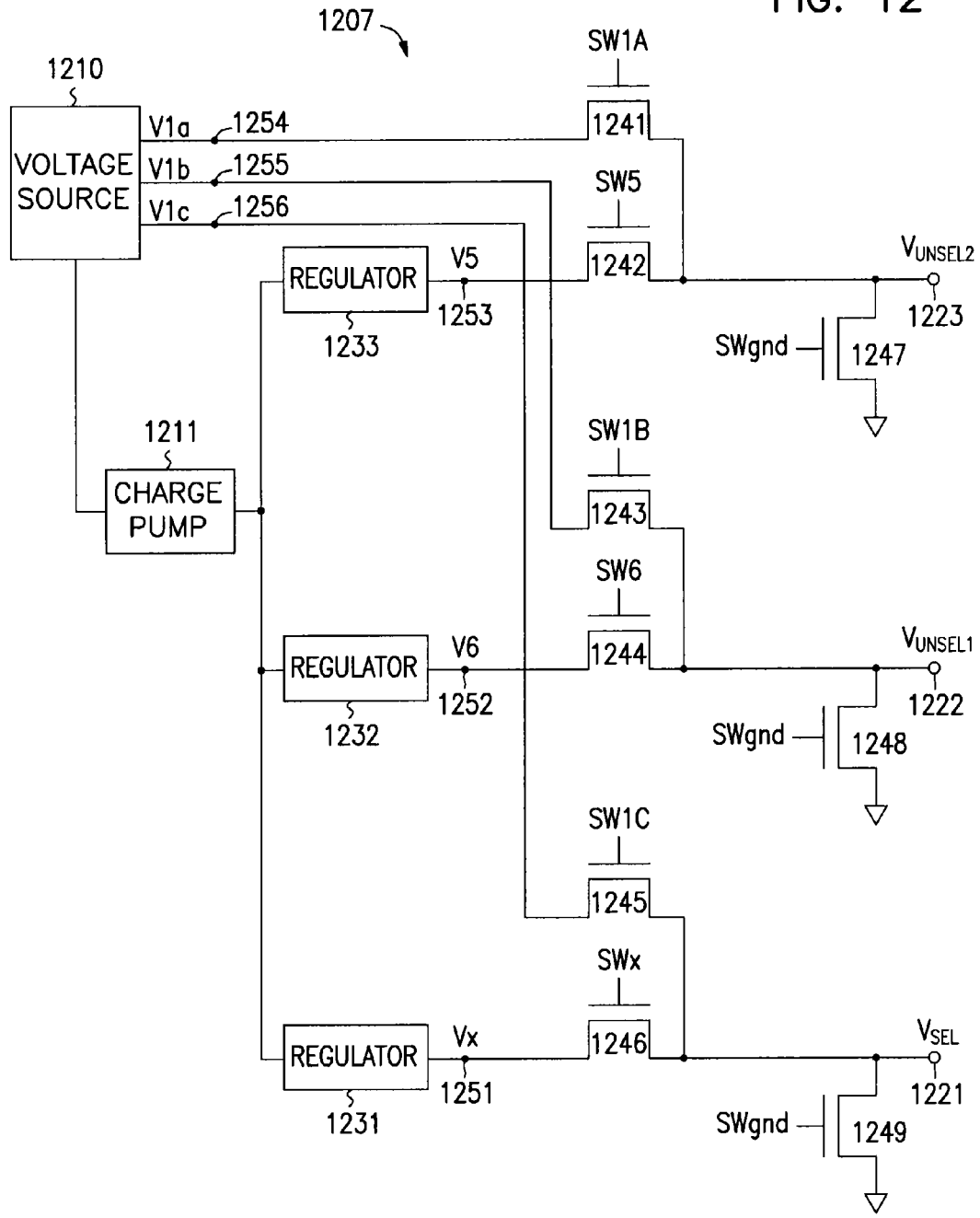
FIG. 12 shows a schematic diagram of a voltage generator having an intermediate voltage, according to an embodiment of the invention.

FIG. 12 shows a schematic diagram of a voltage generator 1207 having an intermediate voltage Vx, according to an embodiment of the invention. Voltage generator 1207 can be included in a memory device, such as memory device 100 (FIG. 1), 200 (FIG. 2), or 300 (FIG. 3). For example, voltage generator 1207 can form part of voltage generator 107 of FIG. 1 or voltage generator 307 of FIG. 3.

In FIG. 12, voltage generator 1207 can include a voltage source 1210, a charge pump 1211, regulators 1231, 1232, and 1233, and switches 1241 through 1249. Voltage generator 1207 can include nodes 1254 and 1256 to provide corresponding voltages V1a, V1b, V1c, Vx, V5, and V6.

In FIG. 12, voltage source 1210 can include a supply voltage, such as a supply voltage (e.g., Vcc) of a memory device associated with voltage generator 1207. Voltage source 1210 can be configured to generate voltages V1a, V1b, and V1c.

Charge pump 1211 can be configured to receive a voltage (e.g., Vcc) from voltage source 1210 and generate one or more voltages (e.g., pumped voltages), such as voltages Vx, V5, and V6 that can be equal to or greater than voltage from voltage source 1210. For example, voltage source 1210 can include a voltage of approximately three volts, and charge pump 1211 can generate pumped voltages from approximately three volts to approximately 20 volts or greater.

Regulators 1231, 1232, and 1233 can be configured to provide voltages Vx, V6, and V5 at nodes 1251, 1252, and 1253, respectively.

Each of switches 1241 through 1249 can include only a single transistor having a gate controlled by one of signals SW1A, SW1B, SW1C, SWx, SW5, SW6, and SWgnd. In response to these signals, switches 1241 through 1249 can couple voltages V1a, V1b, V1c, Vx, V5, and V6 from corresponding nodes 1251 through 1256 to nodes 1221, 1222, and 1223 in the forms of signal (e.g., voltage signals) $V_{SEL}$, $V_{UNSEL1}$, and $V_{UNSEL2}$, respectively.

Figure 13:
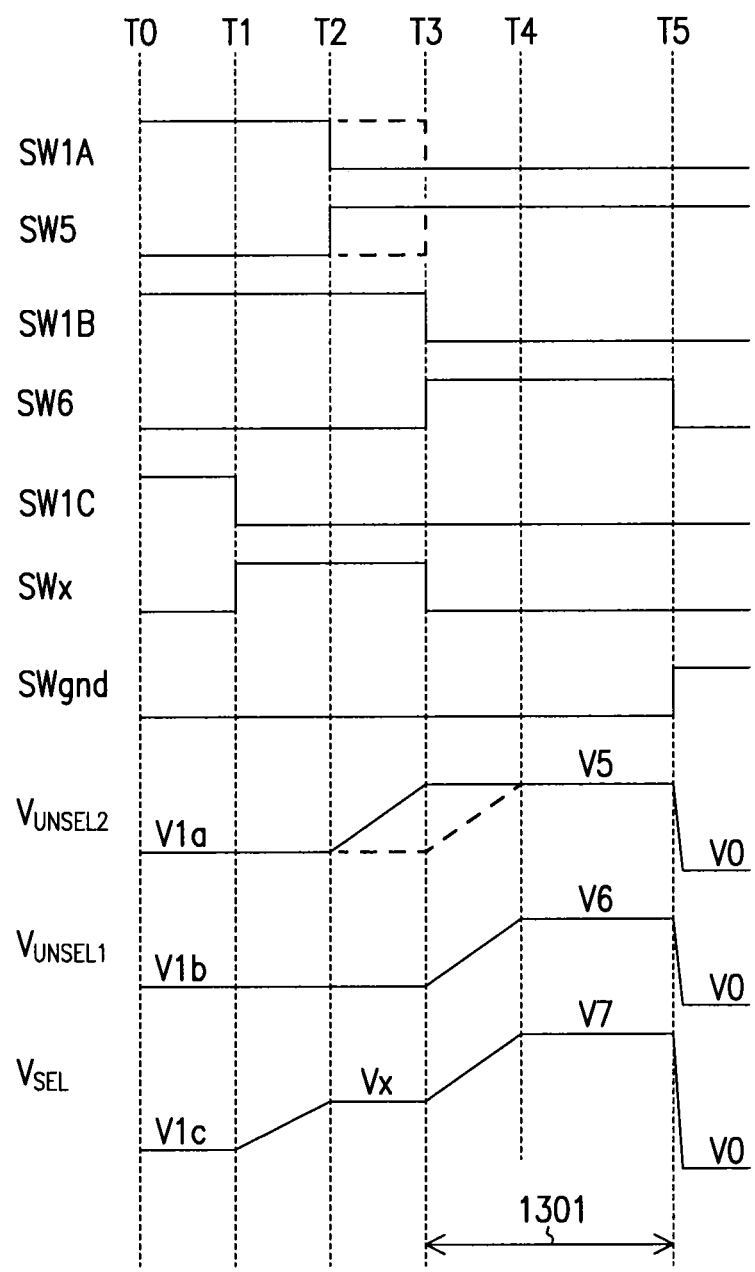
FIG. 13 is an example timing diagram for some signals of FIG. 12 during a memory operation, according to an embodiment of the invention.

FIG. 13 is an example timing diagram for some signals of FIG. 12 during a memory operation, according to an embodiment of the invention. As shown in FIG. 13, each of signals SW1A, SW1B, SW1C, SWx, SW5, SW6, and SWgnd can have different levels (e.g., high and low levels) at different times among times T0, T1, T2, T3, T4, and T5. Based on the level of these signals, switches 1241 through 1246 (FIG. 12) can turn on or off to selectively couple nodes 1221, 1222, and 1223 to voltages V1a, V1b, V1c, Vx, V5 and V6. Switches 1246, 1247, and 1248 can couple nodes 1221, 1222, and 1223 to a ground potential at time T5, e.g., after information is stored into a selected memory cell during a time interval between times T4 and T5. The following description refers to FIG. 12 and FIG. 13.

As shown in FIG. 13, signal SW1A and SW5 can have opposite levels from each other. Switches 1241 and 1242 can turn on or off in response to signals SW1A and SW5, respectively, and couple voltages V1a and V5 to node 1223 at different times in the form of signal $V_{UNSEL2}$. For example, signal SW1A can have one level (e.g., high) between times T0 and T2 and another level (e.g., low) between times T2 and T5. Based on signal SW1A, switch 1241 can turn on between times T0 and time T2 and couple node 1223 to voltage V1a at node 1254. Switch 1241 can turn off between times T2 and time T5 and decouple node 1223 from voltage V1a. Based on signal SW5, switch 1242 can turn off between times T0 to time T2 and decouple node 1223 from voltage V5 at node 1253. Switch 1242 can turn on between times T2 to time T5 and couple node 1223 to voltage V5.

Signal SW1B and SW6 can have opposite levels from each other. Switches 1243 and 1244 can turn on or off in response to signals SW1B and SW6, respectively, and couple voltages V1b and V6 to node 1222 at different times in the form of signal $V_{UNSEL1}$. For example, signal SW1B can have one level (e.g., high) between times T0 and T3 and another level (e.g., low) between times T3 and T5. Based on signal SW1B, switch 1243 can turn on between times T0 to time T3 and couple node 1222 to voltage V1b at node 1255. Switch 1243 can turn off between times T3 to time T5 and decouple node 1222 from voltage V1b. Based on signal SW6, switch 1244 can turn off between times T0 to time T3 and decouple node 1222 from voltage V6 at node 1253. Switch 1244 can turn on between times T3 to time T5 and couple node 1222 to voltage V6.

Signal SW1C (FIG. 13) can have one level (e.g., high) between times T0 and T1 and another level (e.g., low) between times T1 and T5. Switch 1245 can turn on or off in response to signal SW1C and couple voltages V1c to node 1221 in the form of signal $V_{SEL}$. For example, switch 1245 can turn on between times T0 to time T1 and couple node 1221 to voltage V1c at node 1251. Switch 1245 can turn off between times T1 to time T5 and decouple node 1221 from voltage V1c.

Signal SW1C (FIG. 13) can have one level (e.g., high) between times T0 and T1 and another level (e.g., low) between times T1 and T5. Switch 1245 can turn on or off in response to signal SW1C and couple voltages V1c to node 1221 in the form of signal $V_{SEL}$. For example, switch 1245 can turn on between times T0 to time T1 and couple node 1221 to voltage V1c at node 1251. Switch 1245 can turn off between times T1 to time T5 and decouple node 1221 from voltage V1c.

Signal SWx (FIG. 13) can have one level (e.g., low) between times T0 and T1 and between times T3 and T5, and another level (e.g., high) between times T1 and T3. Switch 1246 can turn on or off in response to signal SWx and couple voltages V1c and Vx node 1221 in the form of signal $V_{SEL}$. For example, switch 1246 can turn off between times T0 and T1 decouple node 1221 from voltage Vx. Switch 1246 can turn on between times T1 to time T3 and couple node 1221 to voltage Vx. At time T3, switch 1246 can turn off and decouple node 1221 from voltage Vx.

Although node 1221 can be decoupled from node 1251 at time T3, the voltage on node 1221 can increase from voltage Vx to voltage V7, as shown in FIG. 13. This can occur if node 1221 is coupled to a selected line during a time interval 1301 (between times T3 and T5) and the selected line is placed in a floating state during the same time interval (e.g., time interval 1301). As described above with reference to FIG. 3 and FIG. 4, due to coupling capacitances, the voltage on a selected line (e.g., line 352) can increase when the selected line is placed in a floating state. In FIG. 13, an increase from voltage Vx to voltage V7 during time interval 1301 can be attributed to coupling capacitances associated with the selected line during time interval 1301. If node 1221 is not coupled to a selected line during time interval 1301, node 1221 can remain at voltage Vx from time T2 to time T5.

In FIG. 13, dashed portions associated with signals SW1A, SW5, $V_{UNSEL2}$ represent a variation for these signals. In such a variation, the dashed portions can replace their respective solid portions. For example, instead of changing between levels at time T2, signals SW1A and SW5 can change between levels at time T3, as indicated by the dashed portion associated with signals SW1A and SW5. In this example, signal $V_{UNSEL2}$ can also change accordingly. For example, instead of changing from voltage V1a to voltage V5 between times T2 and T3, signal $V_{UNSEL2}$ can change from voltage V1a to voltage V5 between times T3 and T4, as indicated by the dashed portion associated with signal $V_{UNSEL2}$ between times T2 and T3.

Voltage generator 1207 in FIG. 12 can be part of voltage generator 307 of memory device 300 in FIG. 3, such that voltages V1a, V1b, V1c, Vx, V5 and V6 on lines 350 through 357 in FIG. 6 can be applied from the same voltages V1a (solid portion in FIG. 13), V1b, V1c, Vx, V5 (solid portion in FIG. 13) and V6 generated by voltage generator 1207 in FIG. 12. Time interval 1301 between times T3 and T5 in FIG. 13 can correspond to a time interval between times T3 and T5 of FIG. 6.

Voltage generator 1207 in FIG. 12 can be part of voltage generator 307 of memory device 300 in FIG. 3, such that voltages V1a, V1b, V1c, Vx, V5 and V6 on lines 350 through 357 in FIG. 7 can be applied from the same voltages V1a (dashed portion in FIG. 13), V1b, V1c, V5 (dashed portion in FIG. 13) and V6 generated by voltage generator 1207 in FIG. 12. Time interval 1301 between times T3 and T5 in FIG. 13 can correspond to a time interval between times T3 and T5 of FIG. 7.

Figure 14:
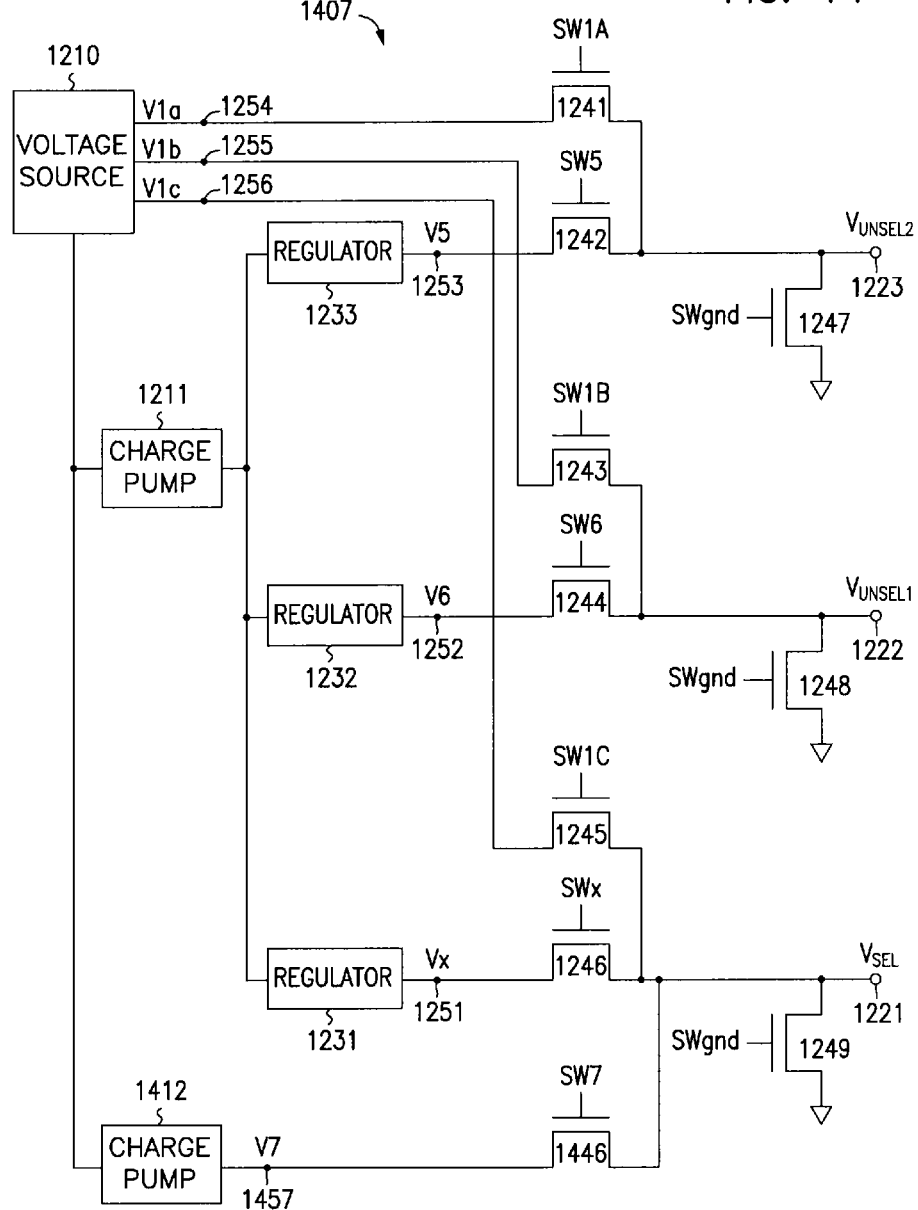
FIG. 14 shows a schematic diagram of a voltage generator having an intermediate voltage and two charge pumps, according to an embodiment of the invention.

FIG. 14 shows a schematic diagram of a voltage generator 1407 having an intermediate voltage Vx and two charge pumps 1211 and 1412, according to an embodiment of the invention. Voltage generator 1407 can include elements similar to or identical to those of voltage generator 1207 of FIG. 12. Such elements are given the same designation labels. For simplicity, detailed description of similar or identical elements between FIG. 12 and FIG. 14 is not repeated in the description of FIG. 14.

As shown in FIG. 14, charge pump 1412 can generate a voltage V7 at node 1457 Voltage generator 1407 can include a switch 1449 that can respond to a signal SW7 and selectively couple node 1221 to node 1457 to provide voltage V7 to node 1221.

Each of charge pumps 1211 and 1412 can include a number of stages (e.g., pumping stage) where the stages can provide voltages of different values. In each of charge pumps 1211 and 1412, a maximum value of a voltage generated by the charge pump can be proportional to the number of the stages of the charge pump. Charge pump 1412 can include a greater number of stages than charge pump 1211. Thus, charge pump 1412 can generate a voltage having a value (e.g., maximum value) greater than the values of voltages in charge pumps 1211. For example, voltage V7 (FIG. 14) can have a value greater than a value of each of voltages Vx, V5, and V6.

Figure 15:
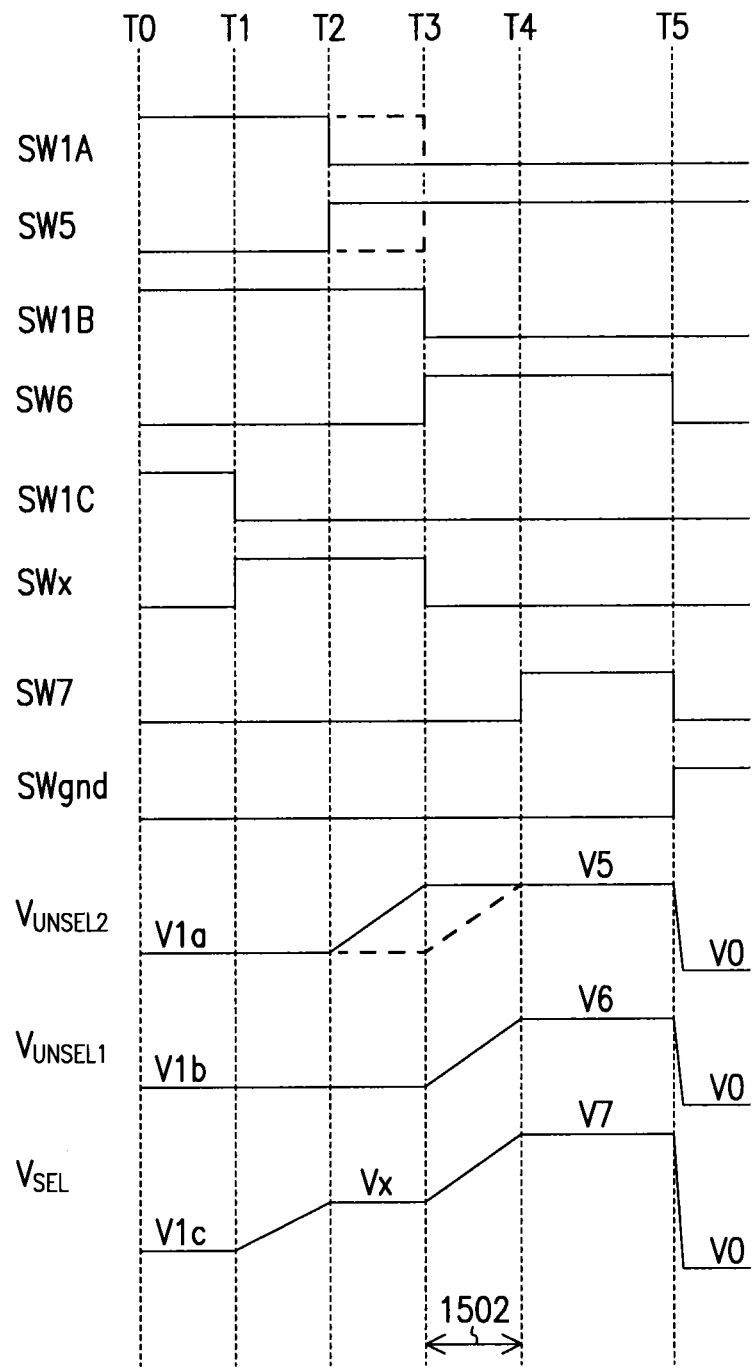
FIG. 15 is an example timing diagram for some signals of FIG. 14 during a memory operation, according to an embodiment of the invention.

FIG. 15 is an example timing diagram for some signals of FIG. 14 during a memory operation, according to an embodiment of the invention. FIG. 15 includes elements (e.g., signals) similar to or identical to those of FIG. 13. For simplicity, detailed description of similar or identical elements between FIG. 13 and FIG. 15 is not repeated in the description of FIG. 15. The following description refers to FIG. 14 and FIG. 15.

In FIG. 15, signal SW7 can have one level (e.g., low) between times T0 and T4 and another level (e.g., high) between times T4 and T5. Switch 1446 can turn on or off in response to signal SW7 and selectively couple voltage V7 to node 1221. For example, switch 1446 can turn off between times T0 to time T4 and decouple node 1221 from voltage V7 at node 1457. Switch 1446 can turn on between times T4 to time T5 and couple node 1221 to voltage V7.

As shown in FIG. 15, between times T3 and T4, signals SW1C and SWx can have a level (e.g., low) such that both switches 1245 and 1246 (FIG. 14) can also turn off. Thus, between times T3 and T4, both switches 1245 and 1246 can turn off and decouple node 1221 from nodes 1251 and 1256. Thus, between times T3 and T4, node 1221 can be decoupled from nodes 1251 (e.g. switch 1246 turns off), 1256 (switch 1254 turns off), and 1457 (switch 1446 turns off).

Although node 1221 can be decoupled from nodes 1251, 1256, and 1457 between times T3 and T5, the voltage on node 1221 can increase from voltage Vx to voltage V7, as shown in FIG. 15. This can occur if node 1221 is coupled to a selected line during a time interval 1502 (between times T3 and T4) and the selected line is placed in a floating state during the same time interval (e.g., time interval 1502). As described above with reference to FIG. 3 and FIG. 4, due to coupling capacitances, the voltage on a selected line (e.g., line 352) can increase when the selected line is placed in a floating state. In FIG. 15, an increase from voltage Vx to voltage V7 during time interval 1502 can be attributed to coupling capacitances associated with the selected line during time interval 1502. If node 1221 (FIG. 14) is not coupled to a selected line during time interval 1502, node 1221 can remain at voltage V1c from between times T3 and T4.

In FIG. 15, dashed portions associated with signal SW1A, SW5, $V_{UNSEL2}$ represent a variation for these signals, as described above with reference to FIG. 13.

Voltage generator 1407 in FIG. 14 can be part of voltage generator 307 of memory device 300 in FIG. 3, such that voltages V1a, V1b, V1c, Vx, V5, V6 and V7 on lines 350 through 357 in FIG. 6 can be applied from the same voltages V1a (solid portion in FIG. 15), V1b, V1c, Vx, V5 (solid portion in FIG. 15), V6, and V7 generated by voltage generator 1407 in FIG. 14. Time interval 1502 between times T3 and T4 in FIG. 15 can correspond to a time interval between times T3 and T4 of FIG. 6.

Voltage generator 1407 in FIG. 14 can be part of voltage generator 307 of memory device 300 in FIG. 3, such that voltages V1a, V1b, V1c, Vx, V5, V6 and V7 on lines 350 through 357 in FIG. 5 can be applied from the same voltages V1a (dashed portion in FIG. 15), V1b, V1c, Vx, V5 (dashed portion in FIG. 15), V6, and V7 generated by voltage generator 1407 in FIG. 14. Time interval 1502 between times T3 and T4 in FIG. 15 can correspond to a time interval between times T3 and T4 of FIG. 7.

Figure 16:
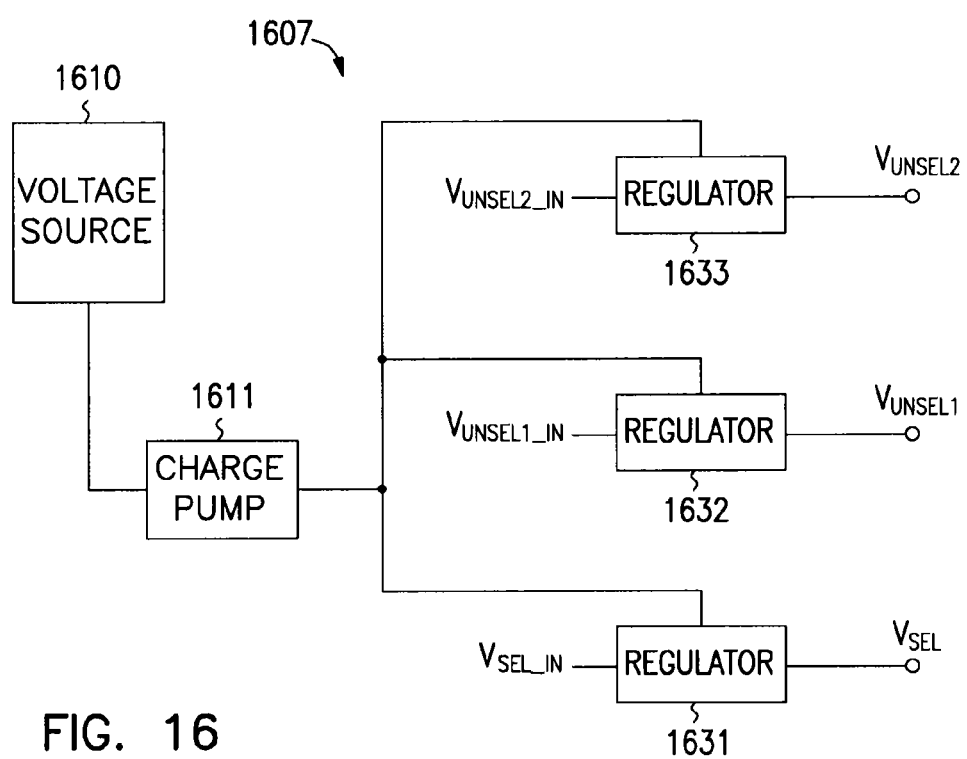
FIG. 16 shows a schematic diagram of a voltage generator including regulators having variable outputs, according to an embodiment of the invention.

FIG. 16 shows a schematic diagram of a voltage generator 1607 including regulators 1631, 1632, 1633 having variable outputs, according to an embodiment of the invention. Voltage generator 1607 can be included in a memory device, such as memory device 100 (FIG. 1), 200 (FIG. 2), or 300 (FIG. 3). For example, voltage generator 1607 can form part of voltage generator 107 of FIG. 1 or voltage generator 307 of FIG. 3.

In FIG. 16, voltage generator 1607 can include a voltage source 1610 and a charge pump 1611. Voltage source 1610 can include a supply voltage, such as a supply voltage (e.g., Vcc) of a memory device associated with voltage generator 1607. Charge pump 1611 can be configured to receive a voltage (e.g., Vcc) from voltage source 1610 and generate one or more voltages (e.g., pumped voltages). The voltages generated by charge pump can be provided to regulators 1631, 1632, and 1633.

Regulators 1631, 1632, and 1633 can generate voltages in the forms of signals (e.g., output voltage signals) $V_{SEL}$, $V_{UNSEL1}$, and $V_{UNSEL2}$, respectively. Regulators 1631, 1632, and 1633 can have voltage gains, e.g., G1, G2, and G3, respectively. Each of voltage gains G1, G2, and G3 can have a value greater than one. The value (e.g., voltage value) of each of signals $V_{SEL}$, $V_{UNSEL1}$, and $V_{UNSEL2}$ can be based on a function (e.g., product) of the gain of a corresponding regulator 1631, 1632, or 1633 and a corresponding signal (e.g., input voltage signal) $V_{SEL\_IN}$, $V_{UNSEL1\_IN}$, or $V_{UNSEL2\_IN}$. For example, $V_{SEL}$=G1*$V_{SEL}$ ("*" denotes multiplication symbol). $V_{UNSEL1}$=G2*$V_{UNSEL1\_IN}$. $V_{UNSEL2}$=G3*$V_{UNSEL2\_IN}$. The values of signals $V_{SEL}$, $V_{UNSEL1}$, and $V_{UNSEL2}$ can be changed (e.g., varied) by, for example, changing the values of signals $V_{SEL\_IN}$, $V_{UNSEL1\_IN}$, and $V_{UNSEL2\_IN}$, respectively.

Figure 17:
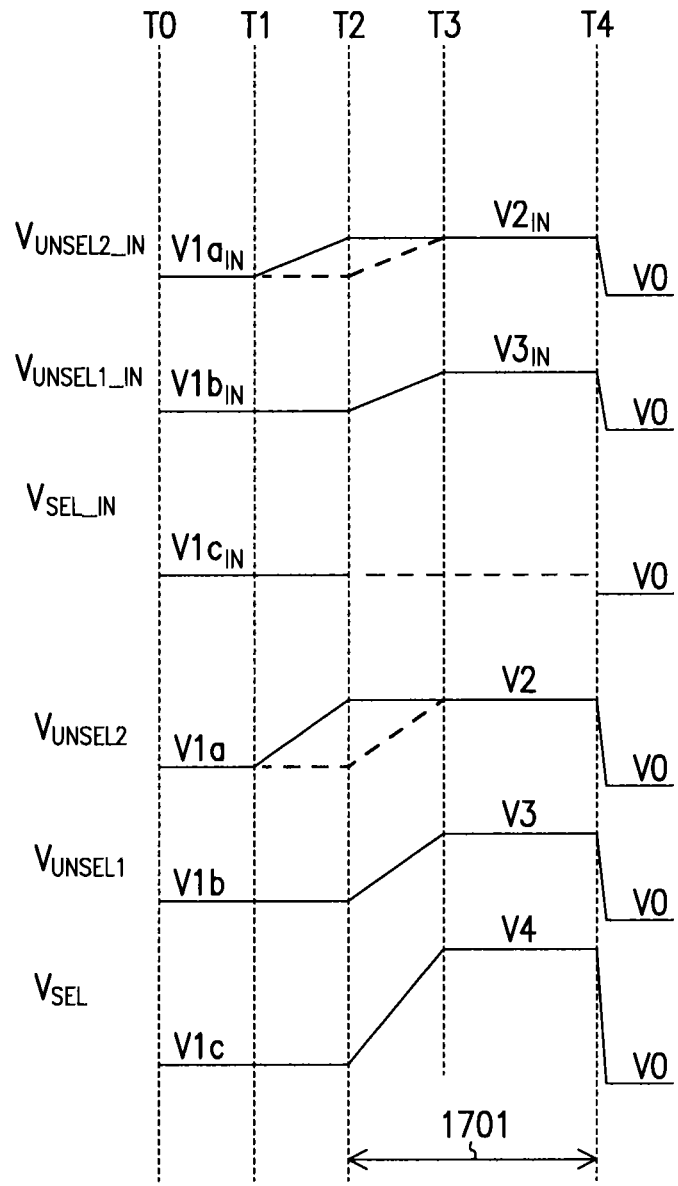
FIG. 17 is an example timing diagram for some of the signals of FIG. 16 during a memory operation, according to an embodiment of the invention.

FIG. 17 is an example timing diagram for some of the signals of FIG. 16 during a memory operation, according to an embodiment of the invention. As shown in FIG. 17, the value (e.g., voltage value) of signal $V_{UNSEL2\_IN}$ can change from voltage V1$a_{IN}$ (e.g., during a time interval between times T0 and T1) to voltage V2$_{IN}$ (e.g., during a time interval between times T2 and T4). Thus, the value of signal $V_{UNSEL2}$ can also change accordingly. For example, the value of signal $V_{UNSEL2}$ can change from voltage V1a (e.g., during a time interval between times T0 and T1) to voltage V2 (e.g., during a time interval between times T2 and T4).

The value (e.g., voltage value) of signal $V_{UNSEL1\_IN}$ can change from voltage V1$b_{IN}$ (e.g., during a time interval between times T0 and T2) to voltage V3$_{IN}$ (e.g., between times T3 and T4). Thus, the value of signal $V_{UNSEL1}$ can also change accordingly. For example, the value of signal $V_{UNSEL1}$ can change from voltage V1b (e.g., during a time interval between times T0 and T2) to voltage V3 (e.g., during a time interval between times T3 and T4).

Signal $V_{SEL\_IN}$ can be provided with a voltage V1c during a time interval between times T0 and T2. A time interval 1701 (between times T2 and T4) can corresponds to a time interval where a selected line (e.g., selected access line) in a memory device (e.g., the memory device associated with voltage generator 1607) is placed in a floating state. Thus, between times T2 and T4, signal $V_{SEL\_IN}$ can have a value, such as a "don't care" value, as indicated by a dashed line in FIG. 17.

Signal $V_{SEL}$ can be provided with a voltage V1c during a time interval between times T0 and T2 and a voltage V4 during a time interval between times T2 and T4.

In FIG. 17, voltages V0, V1a, V1b, V1c, V2, V3, and V4 can have values similar to or identical to those described above with reference to FIG. 4, FIG. 5, and FIG. 8 through FIG. 11.

As described above with reference to FIG. 16 and FIG. 17, each of signals $V_{SEL}$, $V_{UNSEL1}$, and $V_{UNSEL2}$ can have values (e.g., voltage values) that can vary (e.g., changing in values between time T0 and T4). Thus, the output (e.g., signal $V_{SEL}$, $V_{UNSEL1}$, or $V_{UNSEL2}$) of each of regulators 1631, 1632, and 1633 can include a variable output signal.

In FIG. 17, dashed portions associated with signals $V_{UNSEL2\_IN}$ and V1a represent a variation for these signals. In such a variation, the dashed portions can replace their respective solid portions. For example, instead of changing between levels (e.g., between high and lows) at time T1, signals $V_{UNSEL2\_IN}$ can change between levels at time T2, as indicated by the dashed portion associated with signal $V_{UNSEL2\_IN}$. In this example, signal $V_{UNSEL2\_IN}$ can also change accordingly. For example, instead of changing from voltage V1a to voltage V2 between times T1 and T2, signal $V_{UNSEL2}$ can change from voltage V1a to voltage V2 between times T2 and T3, as indicated by the dashed portion associated with signal $V_{UNSEL2}$ between times T2 and T3.

Figure 18:
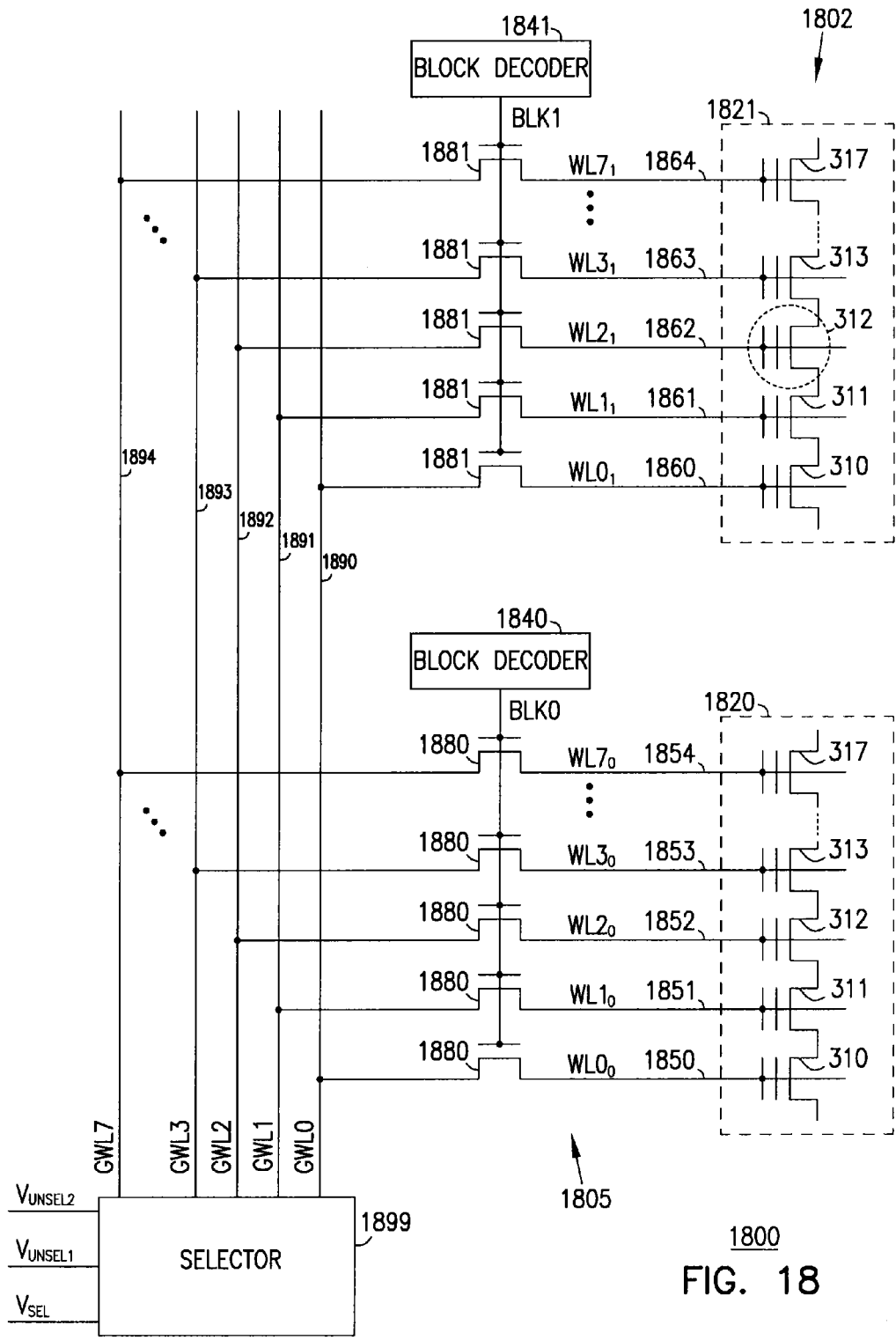
FIG. 18 shows a schematic diagram of a portion of a memory device including an access line voltage controller, according to an embodiment of the invention.

FIG. 18 shows a schematic diagram of a portion of a memory device 1800 including access line voltage controller 1805, according to an embodiment of the invention. Access line voltage controller 1805 can form part of access line voltage controller 305 of FIG. 3. In FIG. 18, memory device 1800 can include a memory array 1802 having memory blocks 1821 and 1822 with corresponding memory cells 310, 311, 312, 313, and 317. FIG. 18 shows an example of two memory blocks and five memory cells in each block. The number memory blocks and memory cells can vary.

Memory device 1800 can include lines 1850, 1851, 1852, 1853, and 1854 (associated with $WL0_0$, $WL1_0$, $WL2_0$, $WL3_0$, and $WL7_0$, respectively) to access memory cells 310, 311, 312, 313, and 317 in memory block 1820. Memory device 1800 can include lines 1860, 1861, 1862, 1863, and 1864 (associated with $WL0_1$, $WL1_1$, $WL2_1$, $WL3_1$, and $WL7_1$, respectively) to access memory cells 310, 311, 312, 313, and 317 in memory block 1821. Lines 1850, 1851, 1852, 1853, 1854 and lines 1860, 1861, 1862, 1863, and 1864 can form part of local access lines of memory device 1800. FIG. 18 shows an example of five lines (e.g., five local access lines) coupled to each of memory cell blocks 1820 and 1821. The number of these lines can vary.

Memory device 1800 can include lines 1890, 1891, 1892, 1893, and 1894 (associated with signals GWL0, GWL1, GWL2, GWL3, and GWL7, respectively) that can form part of global access lines of memory device 1800. FIG. 18 shows an example of five lines 1890, 1891, 1892, 1893, and 1894. The number of these lines can vary.

Access line voltage controller 1805 can selectively apply voltages (e.g., based on signals $V_{SEL}$, $V_{UNSEL1}$, and $V_{UNSEL2}$) to lines 1890, 1891, 1892, 1893, and 1894, lines 1850, 1851, 1852, 1853, and 1854, and lines 1860, 1861, 1862, 1863, and 1864 during a memory operation (e.g., a read or write operation). Signals $V_{SEL}$, $V_{UNSEL1}$, and $V_{UNSEL2}$ in FIG. 18 can be provided by a voltage generator, such as voltage generators described above with reference to FIG. 8 through FIG. 17.

In FIG. 18, access line voltage controller 1805 can include a selector 1899 to selectively apply (e.g., couple) signals $V_{SEL}$, $V_{UNSEL1}$, and $V_{UNSEL2}$ to lines 1890, 1891, 1892, 1893, and 1894 during a memory operation. In a memory operation (e.g., a write operation), one of lines 1890, 1891, 1892, 1893, and 1894 can be a selected line (e.g., selected global access line) and two of lines 1890, 1891, 1892, 1893, and 1894 can be lines adjacent to the selected line. Selector 1899 can be configured to apply signal $V_{SEL}$ to the selected line among lines 1890, 1891, 1892, 1893, and 1894, apply signal $V_{UNSEL1}$ to lines adjacent to the selected line, and apply signal $V_{UNSEL2}$ to lines not adjacent to the selected line.

Access line voltage controller 1805 can include block decoders 1840 and 1841. When memory block 1820 is selected in a memory operation (e.g., to store information into a selected memory cell in memory block 1820), block decoder 1840 can activate signal BLK0 to turn on transistors 1880 to couple lines 1850, 1851, 1852, 1853, and 1854 to lines 1890, and 1891, 1892, 1893, and 1894, respectively. When memory block 1821 is selected in a memory operation (e.g., to store information into a selected memory cell in memory block 1821), block decoder 1841 can activate signal BLK1 to turn on transistors 1881 to couple lines 1860, 1861, 1862, 1863, and 1864 to lines 1890, and 1891, 1892, 1893, and 1894, respectively. During a memory operation, only one of signals BLK and BLK1 can be activated at a time.

Figure 19:
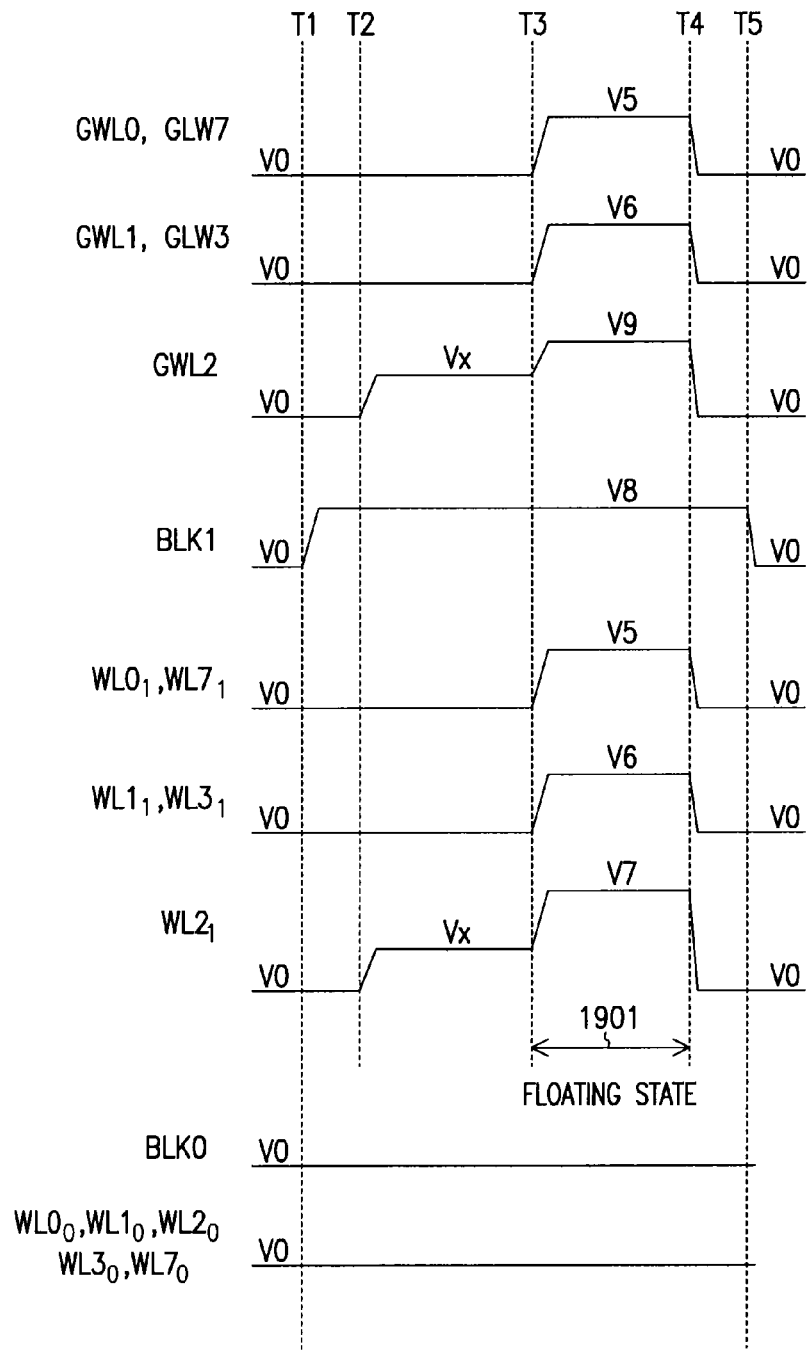
FIG. 19 is an example timing diagram for some of the signals of FIG. 18 during a memory operation, according to an embodiment of the invention.

FIG. 19 is an example timing diagram for some of the signals of FIG. 18 during a memory operation, according to an embodiment of the invention. In the following description with reference to FIG. 18 and FIG. 19, memory cell 312 (shown within a dashed circle in FIG. 18) of memory block 1821 is assumed to be a selected memory cell in an example write operation. Thus, this example, memory block 1821 can be referred to as a selected memory block. Memory block 1820 can be referred to as an unselected memory block. Line 1892 can be referred to as a selected line (e.g., selected global access line). Lines 1891 and 1893 can be referred to as lines adjacent to selected line 1892. Lines 1890 and 1894 can be referred to as lines not adjacent to selected line 1892. In this example, line 1862 can be referred to as a selected line (e.g., selected local access line). Lines 1861 and 1863 can be referred to as lines adjacent to selected line 1862. Lines 1860 and 1864 can be referred to as lines not adjacent to selected line 1862.

As shown in FIG. 19, signal BLK0 is not activated between times T1 and T5. For example, signal BLK0 can remain at the same voltage V0 (e.g., zero volts) between times T1 and T5. Since signal BLK0 is not activated, transistors 1880 (FIG. 18) do not turn on. Thus, lines 1850, 1851, 1852, 1853, and 1854 (FIG. 18) are uncoupled to lines 1890, and 1891, 1892, 1893, and 1894. Lines 1850, 1851, 1852, 1853, and 1854 can be in a floating state. Signals $WL0_0$, $WL1_0$, $WL2_0$, $WL3_0$, and $WL7_0$ associated with lines 1850, 1851, 1852, 1853, and 1854, respectively, can have voltage V0.

Signal BLK1 can be activated between times T1 and T5. For example, signal BLK1 can be provided with a voltage V8 between times T1 and T5. In response to the activated signal BLK1, transistors 1881 (FIG. 18) can turn on and couple lines 1860, 1861, 1862, 1863, and 1864 to lines 1890, and 1891, 1892, 1893, and 1894, respectively. Voltage V8 provided to signal BLK1 (to turn on transistors 1881) can have a value, such that voltages (e.g., V5, V6, and Vx) on lines 1890, and 1891, 1892, 1893, and 1894 can be fully provided (e.g., transferred) to lines 1890, and 1891, 1892, 1893, and 1894, respectively, through transistors 1881.

As shown in FIG. 19, signals GWL0, GWL1, GWL2, GWL3, and GWL7 (associated with lines 1890, and 1891, 1892, 1893, and 1894, respectively) can be provided with voltages V0, V5, Vx, and V9 at different time intervals between times T1 and T5.

For example, signals GWL0 and GWL7 can be provided with voltage V0 between times T1 and T3, voltage V5 between times T3 and T4, and voltage V0 after time T4. Signals GWL1 and GWL3 can be provided with voltage V0 between times T1 and T3, voltage V6 between times T3 and T4, and voltage V0 after time T4. Signal GWL2 can be provided with voltage V0 between times T1 and T2, voltage Vx between times T2 and T3, voltage V9 between times T3 and T4, and voltage V0 after time T4.

The values (e.g., voltage values) of signals $WL0_1$, $WL1_1$, $WL2_1$, $WL3_1$, and $WL7_1$ (associated with lines 1860, and 1861, 1862, 1863, and 1864, respectively) can be based on the values of signals GWL0, GWL1, GWL2, GWL3, and GWL7, respectively.

For example, signals $WL0_1$ and $WL7_1$ can be provided with voltage V0 between times T1 and T3, voltage V5 between times T3 and T4, and voltage V0 after time T4. Signals $WL1_1$ and $WL3_1$ can be provided with voltage V0 between times T1 and T3, voltage V6 between times T3 and T4, and voltage V0 after time T4. Signal $WL2_1$ can be provided with voltage V0 between times T1 and T2, voltage Vx between times T2 and T3, voltage V7 between times T3 and T4, and voltage V0 after time T4.

Between times T3 and T4, line 1862 can be placed in a floating state, such as floating state 1901. Placing line 1862 in the floating state can include turning off transistor 1881 located between lines 1862 and 1892 between times T3 and T5, such that line 1862 can be decoupled from line 1892. Turning off transistor 1881 located between lines 1862 and 1892 can include providing voltage V9 to line 1892 (e.g., at time T3 when signals $WL1_1$ and $WL3_1$ increase from voltage V0 to voltage V6). Since signal BLK1 is provided with voltage V8 to turn on transistors 1881 (including transistor 1881 between lines 1862 and 1892), the values of voltages V8 and V9 can be selected such that transistor 1881 located between lines 1862 and 1892 can turn off (while other transistors 1881 remain turned on). For example, voltage V9 can have a value equal to the value of voltage V8. As an example, each of voltages V8 and V9 can have a value of approximately 15 volts. Voltages Vx, V5, V6, and V7 can have values of equal to those of voltages Vx, V5, and V7 described above with reference to FIG. 6 through FIG. 17.

As described above with reference to FIG. 18 and FIG. 19, line 1862 (selected local access line) in can be placed in a floating state (e.g., floating state 1901 in FIG. 19) between times T3 and T4. Although line 1862 can be placed in a floating state between times T3 and T4, the coupling capacitances from lines 1861 and 1863 (adjacent to the selected local access line) can cause the voltage on line 1862 to change (e.g., increase) from voltage Vx to voltage V7. Voltage V7 can be a programming voltage to store information into the selected memory cell, such as storing information into memory cell 312 in memory block 1821 between times T3 and T4 in this example. Thus, a programming voltage (e.g., voltage V7, as described above with reference to FIG. 18 and FIG. 19) described herein can be generated locally in a local access line (e.g., line 1862 in FIG. 18) of a memory array (e.g., memory 1802 in FIG. 18).

The illustrations of apparatuses (e.g., memory devices 100, 200, and 300) and components thereof (e.g., control circuit 116 and/or voltage generators 307, 807, 1007, 1207, and 1407) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, and 300) or a system (e.g., a computer, a cellular phone, or other electronic system) that includes a device such as memory devices 100, 200, and 300.

Any of the components described above with reference to FIG. 1 through FIG. 15 can be implemented in a number of ways, including simulation via software. Thus, apparatuses (e.g., memory devices 100, 200, and 300) and the components thereof (e.g., control circuit 116 and/or voltage generators 107, 307, 807, 1007, 1207, and 1407) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 300, and voltage generators 307, 807, 1007, 1207, and 1407 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatus may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 15 include apparatuses and methods having memory cells and access lines coupled to the memory cells. In at least one such embodiment, the access lines include a first access line and a second access line. The first access line can be adjacent to the second access line. The memory cells include a memory cell associated with the second access line. A module can be configured to apply a voltage to the first access line during an operation of accessing the memory cell associated with the second access line, and to place the second access line in a floating state during at least a portion of a time interval within the operation. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   memory cells;
   access lines coupled to the memory cells, the access lines including a first access line and a second access line, the first access line being adjacent to the second access line, the memory cells including a memory cell associated with the second access line; and
   a module coupled to the access lines and configured to apply a voltage to the first access line during an operation of accessing the memory cell associated with the second access line, and the module configured to place the second access line in a floating state when information is stored in the memory cell during at least a portion of a time interval within the operation.

2. The apparatus of claim 1, further comprising a node to receive a supply voltage, wherein the voltage applied to the first access line has a value greater than a value of the supply voltage.

3. The apparatus of claim 1, wherein the access lines include a third access line adjacent to the second access line, and the module is configured to apply an additional voltage to the third access line during the at least a portion of the time interval.

4. The apparatus of claim 3, wherein the module includes a charge pump to generate the additional voltage and the voltage applied to the first access line.

5. The apparatus of claim 1, wherein the module is configured to apply an additional voltage to the second access line after the second access line is in the floating state and while the voltage is applied to the first access line.

6. The apparatus of claim 5, wherein the module includes a charge pump to generate the additional voltage.

7. The method of claim 5, wherein the module includes at least one regular having a variable output to provide the voltage and the additional voltage.

8. The apparatus of claim 6, wherein the module further includes an additional charge pump to generate the voltage applied to the first access line.

9. The apparatus of claim 1, wherein the module includes a control circuit.

10. The apparatus of claim 1, wherein the module includes a voltage generator.

11. The apparatus of claim 1, wherein the module includes a control circuit and a voltage generator.

12. The apparatus of claim 1, wherein the apparatus includes a memory device.

13. The apparatus of claim 1, wherein the apparatus includes a system.

14. An apparatus comprising:
memory cells;
access lines coupled to the memory cells, the access lines including a first access line and a second access line, the first access line being adjacent to the second access line; and
a module coupled to the access lines and configured to cause a signal at the first access line to be at a first level during a first time interval of an operation of storing information into at least one of the memory cells coupled to the second access line, to cause the signal to increase from the first level to a second level during a second time interval of the operation, and to place the second access line in a floating state during at least a portion of the second time interval.

15. The apparatus of claim 14, wherein the module is configured to store the information into the at least one of the memory cells coupled to the second access line during the second time interval.

16. The apparatus of claim 14, wherein the module is configured to cause a level of a signal at the second access line during the first time interval to be greater than the second level of the signal at the first access line.

17. The apparatus of claim 14, wherein the access lines include a third access line adjacent to the second access line, and the module is configured cause a signal at the third access line to be at a third level during the first time interval and to cause the signal at the third access line to increase from the third level to a fourth level during the second time interval.

18. The apparatus of claim 17, wherein the first level and the third level have different values.

19. The apparatus of claim 18, wherein the second level and the fourth level have different values.

20. An apparatus comprising:
memory cells;
access lines coupled to the memory cells, the access lines including a first access line and a second access line, the first access line being adjacent to the second access line; and
a module including nodes to provide voltages, the module configured to:
couple the first access line to a first node among the nodes during a first time interval and a second time interval of an operation of storing information into a selected memory cell among the memory cells, the selected memory cell being associated with the second access line;
couple the second access line to a second node among the nodes during the first time interval;
decouple the second access line from the second node during at least a portion of the second time interval; and
couple the second access line to the second node during another portion of the second time interval.

21. The apparatus of claim 20, wherein the module includes a charge pump configured to provide one of the voltages to the first node.

22. The apparatus of claim 21, wherein the module includes an additional charge pump configured to provide one of the voltages to the second node.

23. An apparatus comprising:
memory cells;
access lines coupled to the memory cells, the access lines including a first access line and a second access line, the first access line being adjacent to the second access line; and
a module including nodes to provide voltages, the module configured to:
couple the first access line to a first node among the nodes during a first time interval and a second time interval of an operation of storing information into a selected memory cell among the memory cells, the selected memory cell being associated with the second access line;
couple the second access line to a second node among the nodes during the first time interval; and
decouple the second access line from the second node during at least a portion of the second time interval, the module including a charge pump configured to provide one of the voltages to the first node during the second time interval and to provide one of the voltages to the second node during the first time interval, wherein the module is configured to couple the second access line to the second node during another portion of the second time interval.

24. The apparatus of claim 23, wherein the module is configured to decouple the charge pump from the second node during the second time interval, and the module includes an additional charge pump configured to provide one of the voltages to the second node during at least a portion of the second time interval.

25. A method comprising:
applying a voltage to an unselected access line of an apparatus during a time interval of an operation of storing information into a memory cell associated with a selected access line of the apparatus, the unselected access line being adjacent to the selected access line; and placing the selected access line in a floating state when information is stored in the memory cell during at least a portion of the time interval.

26. The method of claim 25, further comprising:
applying an additional voltage to the unselected access line during the time interval.

27. The method of claim 26, wherein each of the additional voltage and the voltage applied to the unselected access line has a value greater than a value of a supply voltage of the apparatus.

28. The method of claim 25, wherein placing the selected access line in the floating state includes decoupling the access line from a global access line during at least a portion of the time interval.

29. The method of claim 25, further comprising:
applying an additional voltage to the selected access line after the selected access line is in the floating state and during the time interval.

30. The method of claim 29, wherein the additional voltage has a value greater than a value of a supply voltage of the apparatus.

31. A method comprising:
coupling a first access line of an apparatus to a first voltage during a first time interval of an operation of writing information into a memory cell associated with a second access line of the apparatus, the first access line being adjacent to the second access line;
coupling the first access line to a second voltage during a second time interval of the operation;
coupling the second access line to a third voltage during the first time interval; decoupling the second access line from the third voltage during at least a portion of the second time interval; and
coupling the second access line to a fourth voltage during another portion of the second time interval.

32. The method of claim 31, further comprising:
not coupling the second access line to another voltage during the second time interval.

33. The method of claim 31, wherein the third voltage has a value greater than a value of the second voltage.

34. The method of claim 31, wherein the third voltage has a value less than a value of the second voltage.

35. The method of claim 31, further comprising:
coupling a third access line of the apparatus to a fourth voltage during the first time interval, the third access line being adjacent to the second access line;
coupling the third access line to a fifth voltage during the second time interval.

36. The method of claim 31, wherein the fourth voltage has a value greater than a value of the second voltage.

37. The method of claim 31, wherein a value of the third voltage is equal to a value of the fourth voltage plus a value of the first voltage and minus a value of the second voltage.

38. A method comprising:
coupling a first access line of an apparatus to a first voltage during a first time interval and a second time interval of an operation of writing information into a memory cell associated with a second access line of the apparatus, the first access line being adjacent to the second access line;
coupling the second access line to a second voltage during the first time interval;
coupling the second access line to a third voltage during the second time interval;
coupling the first access line to a fourth voltage during a third time interval; decoupling the second access line from the third voltage during at least a portion of the third time interval; and
coupling the second access line to a fifth voltage during the third time interval.

39. The method of claim 38, further comprising:
not coupling the second access line to another voltage during the second time interval.

40. The method of claim 38, wherein the third voltage has a value greater than a value of the fourth voltage.

41. The method of claim 38, wherein a value of the third voltage is equal to a value of the fifth voltage plus a value of the first voltage and minus a value of the fourth voltage.

* * * * *

UNITED STATES PATENT AND TRADEMARK OFFICE
CERTIFICATE OF CORRECTION

PATENT NO. : 8,681,561 B2
APPLICATION NO. : 13/214841
DATED : March 25, 2014
INVENTOR(S) : Toru Tanzawa Page 1 of 1

It is certified that error appears in the above-identified patent and that said Letters Patent is hereby corrected as shown below:

In the Claims

In column 21, line 62, in claim 17, after "configured" insert -- to --.

Signed and Sealed this
Twenty-ninth Day of July, 2014

Michelle K. Lee
*Deputy Director of the United States Patent and Trademark Office*